(12) United States Patent
Senda

(10) Patent No.: US 7,420,535 B2
(45) Date of Patent: Sep. 2, 2008

(54) DISPLAY

(75) Inventor: Michiru Senda, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 833 days.

(21) Appl. No.: 10/874,351

(22) Filed: Jun. 24, 2004

(65) Prior Publication Data

US 2004/0263469 A1    Dec. 30, 2004

(30) Foreign Application Priority Data

Jun. 27, 2003    (JP)    ............... 2003-185263

(51) Int. Cl.
    *G09G 3/36*    (2006.01)
(52) U.S. Cl. ............... 345/100; 345/98; 345/99
(58) Field of Classification Search ................ 345/100, 345/98–99, 204
    See application file for complete search history.

(56) References Cited

U.S. PATENT DOCUMENTS 5,949,271 A * 9/1999 Fujikura ............... 327/390

6,891,588 B2 * 5/2005 Kawachi et al. ............. 349/114

FOREIGN PATENT DOCUMENTS

JP    2921510    4/1999

* cited by examiner

*Primary Examiner*—Richard Hjerpe
*Assistant Examiner*—Leonid Shapiro
(74) *Attorney, Agent, or Firm*—McDermott Will & Emery LLP

(57) ABSTRACT

A display capable of suppressing reduction of a scanning property is provided. This display comprises a shift register circuit formed by connecting a plurality of first circuit parts each including a first conductivity type first transistor connected to a first potential and turned on in response to a clock signal, a first conductivity type second transistor connected to a second potential and a first conductivity type third transistor, connected between the gate of the first transistor and the second potential, having two gate electrodes electrically connected with each other.

18 Claims, 13 Drawing Sheets

DISPLAY

BACKGROUND OF THE INVENTION

Field of the Invention

The present invention relates to a display, and more particularly, it relates to a display having a shift register circuit.

CROSS-REFERENCE TO RELATED APPLICATIONS

The priority application number JP2003-185263 upon which this patent application is based is hereby incorporated by reference.

Description of the Background Art

A bootstrap inverter circuit is known in general, as disclosed in Japanese Patent No. 2921510 (IPC: H03K 19/094), for example.

FIG. 19 is a circuit diagram showing a conventional bootstrap inverter circuit. Referring to FIG. 19, the conventional bootstrap inverter circuit includes n-channel transistors NT101, NT102, NT103 and NT104 and a capacitor C101. The transistor NT101 has a source connected to a node ND102, a drain connected to a positive potential VDD and a gate connected to another node ND101. The capacitor C101 is connected between the gate and the source of the transistor NT101. The transistor NT102 has a source connected to the node ND101, a drain connected to the positive potential VDD and a gate supplied with an input signal.

The transistor NT103 has a source connected to a negative potential VSS and a drain connected to the node ND102. The transistor NT104 has a source connected to the negative potential VSS and a drain connected to the node ND101. The gates of the transistors NT103 and NT104 are supplied with a clock signal CLK.

In operation of the conventional bootstrap inverter circuit shown in FIG. 19, the input signal goes high and the clock signal CLK goes low for turning the transistor NT102 and the transistors NT103 and NT104 on and off respectively. Thus, the potential of the node ND101 goes up to a high level (VDD), for turning on the transistor NT101. Therefore, the potential of the node ND102 goes up toward VDD. In this case, the potential of the node ND101 (the gate potential of the transistor NT101) goes up following the potential going up of the node ND102 (the source potential of the transistor NT101) so that the capacitor C101 maintains the gate-to-source voltage of the transistor NT11. Thus, the transistor NT101 is regularly maintained in the ON state during going up of the potential of the node ND102, whereby the potential of the node ND102 goes up to the level of VDD. Consequently, the inverter circuit outputs an output signal of a high level (VDD). In this case, the potential of the node ND101 is in excess of VDD.

Thereafter the input signal goes low and the clock signal CLK goes high, for turning the transistor NT102 off and the transistors NT103 and NT104 on. Thus, the potential of the node ND102 drops to a low level. Consequently, the inverter circuit outputs an output signal of a low level (VSS).

A plurality of the aforementioned bootstrap inverter circuits are serially connected with each other for forming a shift register circuit employable for driving a gate line or a drain line of a liquid crystal display or an organic EL (electroluminescence) display.

In the conventional bootstrap inverter circuit shown in FIG. 19, however, the potential of the node ND101 is in excess of VDD as described above, and hence a bias voltage applied to the transistor NT104 connected to VSS disadvantageously exceeds the potential difference between VDD and VSS. Therefore, the properties of the transistor NT104 tend disadvantageously to be deteriorated. If a shift register circuit including the aforementioned conventional bootstrap inverter circuit is employed for driving a gate line or a drain line of a liquid crystal display or an organic EL display, therefore, the scanning property of the liquid crystal display or the organic EL display is disadvantageously deteriorated.

SUMMARY OF THE INVENTION

The present invention has been proposed in order to provide a display preventable from deterioration of a scanning property.

In order to attain the aforementioned object, a display according to an aspect of the present invention comprises a shift register circuit formed by connecting a plurality of first circuit parts each including a first conductivity type first transistor connected to a first potential and turned on in response to a clock signal, a first conductivity type second transistor connected to a second potential and a first conductivity type third transistor, connected between the gate of the first transistor and the second potential, having two gate electrodes electrically connected with each other.

In the display according to this aspect, the two gate electrodes distribute a voltage applied to the third transistor between sources and drains corresponding to the gate electrodes respectively, whereby a voltage smaller than the difference between the first and second potentials is applied between the source and the drain corresponding to each gate electrode of the third transistor also when a bias voltage applied to the third transistor is in excess of the difference between the first and second potentials. Thus, the third transistor is inhibited from characteristic deterioration resulting from application of a bias voltage exceeding the difference between the first and second potentials, whereby the display including the shift register circuit can be inhibited from reduction of the scanning property. Due to the first conductivity type of the first, second and third transistors, further, the numbers of ion implantation steps and ion implantation masks can be reduced as compared with a case of forming a shift register circuit including transistors of two conductivity types. Thus, a fabrication process can be simplified and a fabrication cost can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
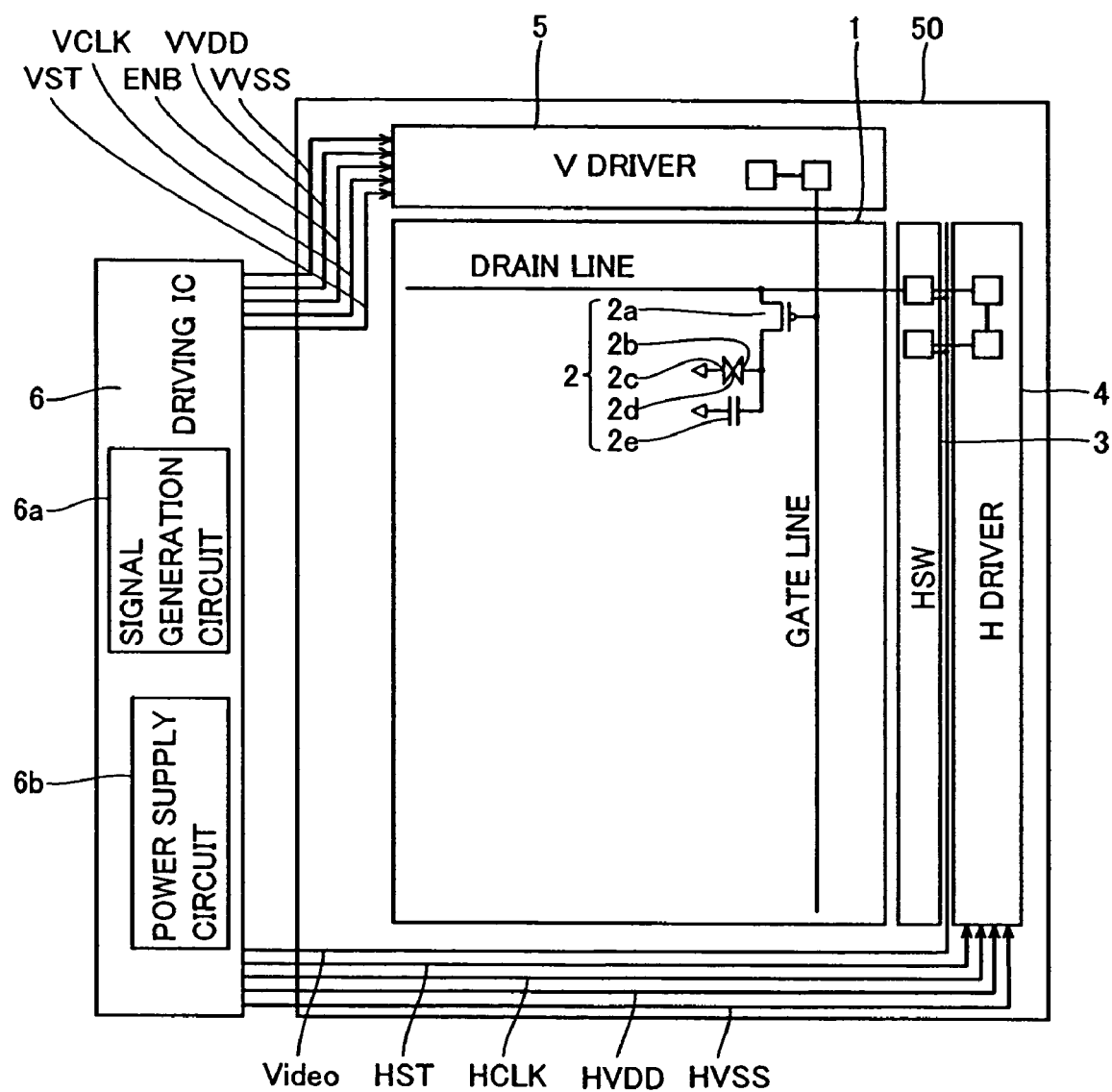
FIG. 1 is a plan view showing a liquid crystal display according to a first embodiment of the present invention.

Referring to FIG. 1, a display part 1 is provided on a substrate 50 in a liquid crystal display according to a first embodiment of the present invention. The display part 1 is illustrated in a structure for one pixel 2 in FIG. 1. Such pixels 2 are arranged on the display part 1 in the form of a matrix. Each pixel 2 is constituted of a p-channel transistor 2a, a pixel electrode 2b, an opposing electrode (common electrode) 2c, common to the respective pixels 2, arranged oppositely to the pixel electrode 2b, a liquid crystal 2d held between the pixel electrode 2b and the common electrode 2c and a storage capacitor 2e. The p-channel transistor 2a has a source connected to a drain line, a drain connected to the pixel electrode 2b and the storage capacitor 2e, and a gate connected to a gate line.

A horizontal switch (HSW) 3 and an H driver 4 are provided on the substrate 50 along one side of the display part 1, in order to drive (scan) drain lines thereof. A V driver 5 is provided on the substrate 50 along another side of the display part 1, in order to drive (scan) gate lines thereof. The horizontal switch 3, including only two switching elements in FIG. 1, has switching elements arranged in a number responsive to that of the pixels 2. Further, each of the H and V drivers 4 and 5, constituted of only two shift registers in FIG. 1, also has shift registers arranged in the number responsive to that of the pixels 2. A driving IC 6 is set outside the substrate 50. This driving IC 6 comprises a signal generation circuit 6a and a power supply circuit 6b. The driving IC 6 supplies the H driver 4 with a video signal Video, a start signal HST, a clock signal HCLK, a positive potential HVDD and a negative potential HVSS. The driving IC 6 also supplies the V driver 5 with a start signal VST, a clock signal VCLK, an enable signal ENB, a positive potential VVDD and a negative potential VVSS. The positive potentials HVDD and VVDD are examples of the "second potential" in the present invention, and the negative potentials HVSS and VVSS are examples of the "first potential" in the present invention.

Figure 2:
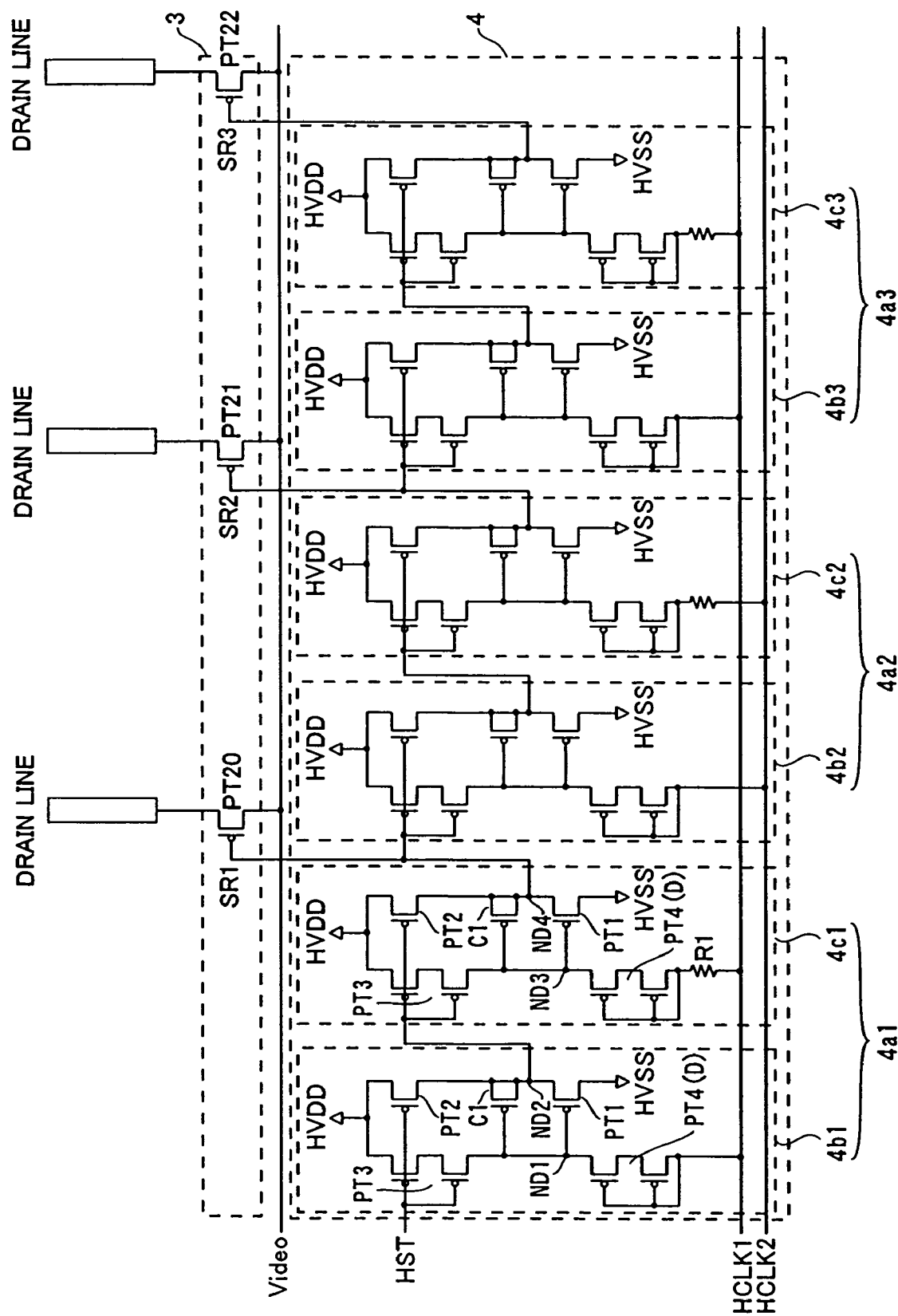
FIG. 2 is a circuit diagram of shift register circuits constituting an H driver of the liquid crystal display according to the first embodiment shown in FIG. 1.

As shown in FIG. 2, the H driver 4 is provided therein with a plurality of stages of shift register circuits 4a1, 4a2 and 4a3. While FIG. 2 shows only three stages of shift register circuits 4a1, 4a2 and 4a3 for simplifying the illustration, such shift registers are provided in the number responsive to that of the pixels 2 in practice. The first-stage shift register circuit 4a1 is constituted of $1^{st}$ and $2^{nd}$ first circuit parts 4b1 and 4c1. The $1^{st}$ first circuit part 4b1 includes p-channel transistors PT1, PT2 and PT3, a diode-connected p-channel transistor PT4 and a capacitor C1 formed by connecting the source and the drain of a p-channel transistor with each other. The p-channel transistors PT1, PT2, PT3 and PT4 are examples of the "first transistor", "second transistor", "third transistor" and "fourth transistor" in the present invention respectively. The $2^{nd}$ first circuit part 4c1 also includes p-channel transistors PT1, PT2, PT3 and PT4 and a capacitor C1, similarly to the $1^{st}$ first circuit part 4b1. The $2^{nd}$ first circuit part 4c1 further includes a high-resistance resistor R1, dissimilarly to the aforementioned $1^{st}$ first circuit part 4b1.

According to the first embodiment, all of the p-channel transistors PT1 to PT4 provided on the $1^{st}$ and $2^{nd}$ first circuit parts 4b1 and 4c1 respectively and the p-channel transistors constituting the capacitors C1 are constituted of TFTs (thin-film transistors) consisting of p-type MOS (metal oxide semiconductor) field-effect transistors. The p-channel transistors PT1 to PT4 are hereinafter also referred to as transistors PT1 to PT4 respectively.

Figure 3:
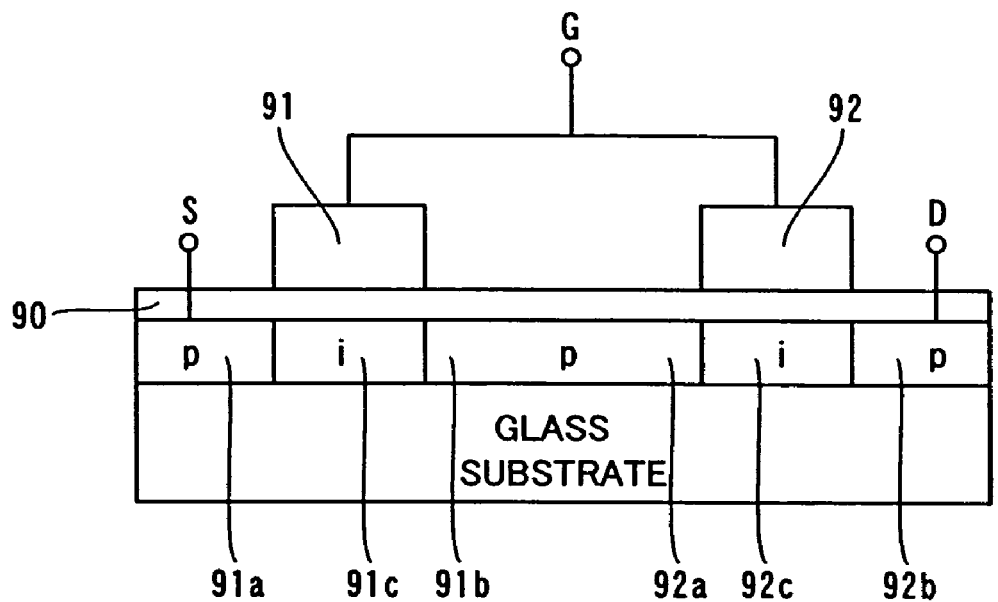
FIG. 3 is a model diagram for illustrating the structure of p-channel transistors each having two gate electrodes.

According to the first embodiment, each of the transistors PT3 and PT4 is formed to have two gate electrodes 91 and 92 electrically connected with each other, as shown in FIG. 3. More specifically, the gate electrodes 91 and 92 are formed on first and second channel regions 91c and 92c through a gate insulator layer 90 respectively. The first channel region 91c is held between a first source region 91a and a first drain region 91b, while the second channel region 92c is held between a second source region 92a and a second drain region 92b. The first drain region 91b and the second source region 92a are constituted of a common impurity region.

As shown in FIG. 2, the transistor PT1 of the $1^{st}$ first circuit part 4b1 has a source connected to a node ND2, a drain connected to the negative potential HVSS and a gate connected to another node ND1 and supplied with a clock signal HCLK1. The transistor PT2 has a source connected to the positive potential HVDD, a drain connected to the node ND2 and a gate supplied with the start signal HST.

According to the first embodiment, the transistor PT3 is connected between the gate of the transistor PT1 and the positive potential HVDD. The gate of this transistor PT3 is supplied with the start signal HST. The transistor PT3 is provided for turning off the transistor PT1 when the transistor PT2 is in an ON state. Thus, the transistors PT1 and PT2 are inhibited from simultaneously turning ON states.

According to the first embodiment, further, the capacitor C1 is connected between the gate and the source of the transistor PT1. The transistor PT4 is connected between the gate of the transistor PT1 and a clock signal line (HCLK1). This transistor PT4 inhibits a high-level pulse voltage of the clock signal HCLK1 from flowing back from the clock signal line (HCLK1) to the capacitor C1.

The $2^{nd}$ first circuit part 4c1 is basically similar in circuit structure to the $1^{st}$ first circuit part 4b1. In the $2^{nd}$ first circuit part 4c1, however, the source of the transistor PT1 and the drain of the transistor PT2 are connected to a node ND4 respectively while the gate of the transistor PT1 is connected to another node ND3. Further, a high-resistance resistor R1 is connected between the transistor PT4 and the clock signal line (HCLK1).

The node ND4 (output node) outputs an output signal SR1 of the first-stage shift register circuit 4a1. This output signal SR1 is supplied to the horizontal switch 3.

The horizontal switch 3 includes a plurality of transistors PT20, PT21 and PT22. While FIG. 2 illustrates only three transistors PT20, PT21 and PT22, the horizontal switch 3 is provided with such transistors in the number responsive to that of the pixels 2 in practice. The transistors PT20, PT21 and PT22 have gates connected to outputs SR1, SR2 and SR3 of the first-, second- and third-stage shift registers 4a1, 4a2 and 4a3 respectively, drains connected to respective stages of drain lines respectively and sources connected to the common video signal line Video respectively. The second-stage shift register circuit 4a2 is connected to the node ND4 (output node) of the first-stage shift register circuit 4a1.

The second-stage shift register circuit 4a2 is constituted of $1^{st}$ and $2^{nd}$ first circuit parts 4b2 and 4c2. The $1^{st}$ and $2^{nd}$ first circuit parts 4b2 and 4c2 of the second-stage shift register circuit 4a2 are similar in circuit structure to the $1^{st}$ and $2^{nd}$ first circuits 4b1 and 4c1 of the aforementioned first-stage shift register circuit 4a1 respectively. An output node of the second-stage shift register circuit 4a2 outputs an output signal SR2. The third-stage shift register circuit 4a3 is connected to the output node of the second-stage shift register circuit 4a2. The outputs SR1 to SR3 of the shift register circuits 4a1 to 4a3 are input in the gates of the switching elements of the horizontal switch 3 provided in the number of the video signal lines (for example, three video signal lines when three types of video signals of red (R), green (G) and blue (B) are input).

The third-stage shift register circuit 4a3 is constituted of $1^{st}$ and $2^{nd}$ first circuit parts 4b3 and 4c3. The $1^{st}$ and $2^{nd}$ first circuit parts 4b3 and 4c3 are similar in circuit structure to the $1^{st}$ and $2^{nd}$ first circuit parts 4b1 and 4c1 of the aforementioned first-stage shift register circuit 4a1 respectively. An output node of the third-stage shift register circuit 4a3 outputs an output signal SR3. A fourth-stage shift register circuit (not shown) is connected to the output node of the third-stage shift register circuit 4a3.

The fourth-stage shift register circuit and those subsequent thereto are similar in circuit structure to the aforementioned first- to third-stage shift register circuits 4a1 to 4a3. A clock signal line (HCLK2) is connected to the aforementioned second-stage shift register circuit 4a2. The clock signal line (HCLK1) is connected to the aforementioned third-stage shift register circuit 4a3, similarly to the first-stage shift register circuit 4a1. Thus, the plurality of stages of shift register circuits are alternately connected with the clock signal lines (HCLK1 and HCLK2). Further, each subsequent shift register circuit is connected to the output node of each precedent shift register circuit.

Figure 4:
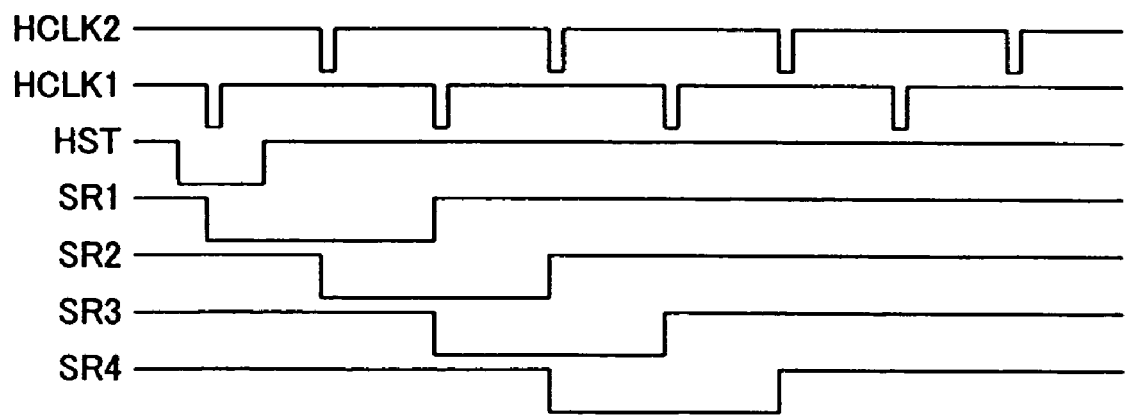
FIG. 4 is a timing chart of the shift register circuits constituting the H driver of the liquid crystal display according to the first embodiment shown in FIG. 2.

Operations of the shift register circuits of the H driver 4 of the liquid crystal display according to the first embodiment are now described with reference to FIGS. 2 and 4. Referring to FIG. 4, symbols SR1, SR2, SR3 and SR4 denote the output signals from the first-, second-, third- and fourth-stage shift register circuits respectively.

In the initial state, the start signal HST of a high level (HVDD) is input in the $1^{st}$ first circuit part 4b1 of the first-stage shift register circuit 4a1. Thus, the transistors PT2 and PT3 are turned off and the transistor PT1 is turned on in the $1^{st}$ first circuit part 4b1, whereby the potential of the node ND2 goes low. Therefore, the transistors PT2 and PT3 are turned on in the $2^{nd}$ first circuit part 4c1. Thus, the potential of the node ND3 goes high, thereby turning off the transistor PT1. The transistors PT2 and PT1 are turned on and off respectively in the $2^{nd}$ first circuit part 4c1, whereby the potential of the node ND4 goes high. Thus, the first-stage shift register circuit 4a1 outputs the output signal SR1 of a high level in the initial state.

When the start signal HST of a low level (HVSS) is input while the first-stage shift register circuit 4a1 outputs the high-level output signal SR1, the transistors PT2 and PT3 are turned on in the $1^{st}$ first circuit part 4b1. Thus, the potentials of the nodes ND1 and ND2 go high for maintaining the transistor PT1 in the OFF state. The transistors PT2 and PT3 are turned off in the $2^{nd}$ first circuit part 4c1 due to the high-level potential of the node ND2. At this time, the potential of the node ND3 is maintained in the high-level state, thereby maintaining the transistor PT1 in the OFF state. Thus, the potential of the node ND4 is maintained in the high-level state, whereby the first-stage shift register circuit 4a1 outputs the high-level output signal SR1.

Then, the clock signal HCLK1 of the low level (HVSS) is input in the $1^{st}$ first circuit part 4b1 through the transistor PT4. At this time, the transistor PT3 is in the ON state and hence the potential of the node ND1 is maintained at the high level. Thus, the transistor PT1 is maintained in the OFF state. While the clock signal HCLK1 is at the low level, a penetration current flows between the clock signal line (HCLK1) and the positive potential HVDD through the transistors PT3 and PT4.

Also in the $2^{nd}$ first circuit part 4c1, the clock signal HCLK1 of the low level (HVSS) is input through the high-resistance resistor R1 and the transistor PT4. At this time, the transistor PT3 is in the OFF state and hence the potential of the node ND3 goes low to turn on the transistor PT1. In this case, the transistor PT1 is turned on at a low response speed due to the high-resistance resistor R1.

At this time, the transistor PT2 is in the OFF state in the $2^{nd}$ first circuit part 4c1, whereby the potential of the node ND4 drops toward HVSS through the ON-state transistor PT1. In this case, the potential of the node ND3 (the gate potential of the transistor PT1) drops following reduction of the potential of the node ND4 (the source potential of the transistor PT1) so that the capacitor C1 maintains the gate-to-source voltage of the transistor PT1. The transistor PT3 is in the OFF state and no high-level signal flows back from the clock signal line (HCLK1) toward the node ND3 in the diode-connected transistor PT4, whereby the holding voltage of the capacitor C1 (the gate-to-source voltage of the transistor PT1) is maintained. Thus, the transistor PT1 is regularly maintained in the ON state during reduction of the potential of the node ND4, so that the potential of the node ND4 drops to HVSS. Consequently, the first-stage shift register circuit 4a1 outputs output signal SR1 of a low level.

When the potential of the node ND4 drops to HVSS in the $2^{nd}$ first circuit part 4c1, the potential of the node ND3 is lower than the negative potential HVSS. Therefore, a bias voltage applied to the transistor PT3 connected to the positive potential HVDD exceeds the potential difference between HVDD and HVSS. When the clock signal HCLK1 goes high (HVDD), a bias voltage applied to the transistor PT4 connected to the clock signal line (HCLK1) also exceeds the potential difference between HVDD and HVSS.

Then, the start signal HST of the high level (HVDD) is input in the $1^{st}$ first circuit part 4b1, thereby turning off the transistors PT2 and PT3. In this case, the nodes ND1 and ND2 enter floating states while keeping the high levels. Therefore, no influence is exerted on the remaining portions and hence the first-stage shift register circuit 4a1 maintains the low-level output signal SR1.

Then, the clock signal HCLK1 of the low level (HVSS) is input in the $1^{st}$ first circuit part 4b1 through the transistor PT4 again. Thus, the transistor PT1 is turned on and hence the potential of the node ND2 drops toward HVSS. In this case, the potential of the node ND1 lowers following reduction of the potential of the node ND2 so that the capacitor C1 maintains the gate-to-source voltage of the transistor PT1. The transistor PT3 is in the OFF state and no high-level signal flows back from the clock signal line (HCLK1) toward the node ND1 in the diode-connected transistor PT4, whereby the holding voltage of the capacitor C1 is maintained. Thus, the transistor PT1 is regularly maintained in the ON state during reduction of the potential of the node ND2, so that the potential of the node ND2 drops to HVSS. Therefore, the transistors PT2 and PT3 of the $2^{nd}$ first circuit parts 4c1 are turned on. When the potential of the node ND2 drops to HVSS, the potential of the node ND1 is lower than HVSS.

At this time, the transistor PT1 is turned off due to the transistor PT3 in the $2^{nd}$ first circuit part 4c1 according to the first embodiment, whereby the transistors PT1 and PT2 are inhibited from entering ON states at the same time. Thus, a penetration current is inhibited from flowing between the positive and negative potentials HVDD and HVSS through the transistors PT1 and PT2.

In the $2^{nd}$ first circuit part 4c1, the transistors PT2 and PT1 are turned on and off respectively, whereby the potential of the node ND4 goes high from HVSS up to HVSS. Therefore, the first-stage shift register 4a1 outputs the high-level output signal SR1.

When the low-level clock signal HCLK1 is input in the shift register circuit 4a1 according to the first embodiment while the $1^{st}$ first circuit part 4b1 receives the low-level start signal HST, the $2^{nd}$ first circuit part 4c1 outputs the low-level output signal SR1 as hereinabove described. When the low-level clock signal HCLK1 is input again while the $1^{st}$ first circuit part 4b1 outputs the high-level output signal SR1, the output signal SR1 from the $2^{nd}$ first circuit part 4c1 goes high.

The output signal SR1 from the $2^{nd}$ first circuit part 4c1 of the first-stage shift register circuit 4a1 is input in the $1^{st}$ first circuit part 4b2 of the second-stage shift register circuit 4a2. When the high-level clock signal HCLK1 and a low-level clock signal HCLK2 are input in the second-stage shift register circuit 4a2 while the $1^{st}$ first circuit part 4b2 receives the low-level output signal SR1 from the first-stage shift register circuit 4a1, the $2^{nd}$ first circuit part 4c2 outputs the output signal SR2 of a low level. When the clock signal HCLK1 of a low level and the clock signal HCLK2 of a high level are input in the third-stage shift register circuit 4a3 while the $1^{st}$ first circuit part 4b3 receives the low-level output signal SR2 from the second-stage shift register circuit 4a2, further, the $3^{rd}$ first circuit part 4c3 outputs the output signal SR3 of a low level. Thus, the output signal from each precedent-stage shift register circuit is input in the subsequent-stage shift register circuit, while the clock signals HCLK1 and HCLK2 going low in deviation from each other are alternately input in the shift register circuits. Thus, the shift register circuits output low-level output signals in a shifted manner.

The low-level signals shifted in timing are input in the gates of the transistors PT20, PT21 and PT22 of the horizontal switch 3, thereby sequentially turning on the transistors PT20, PT21 and PT22. Thus, the video signal line Video supplies video signals to respective stages of drain lines, thereby successively driving (scanning) the drain lines. When the drain lines of all stages connected to a single gate line are completely scanned, the subsequent gate line is selected. The liquid crystal display successively scans the drain lines of the respective stages for selecting the subsequent gate line. The liquid crystal display repeats these operations up to the drain lines connected to the final gate line, thereby terminating scanning of one screen.

According to the first embodiment, as hereinabove described, the transistor PT3 connected between the gate of the transistor PT1 and the positive potential HVDD is so constituted as to have the two gate electrodes 91 and 92 electrically connected with each other, thereby distributing the voltage applied to the transistor PT3 between the sources and the drains corresponding to the gate electrodes 91 and 92 respectively substantially about half-and-half (the voltage distribution ratio varies with the transistor size or the like). Also when the bias voltage applied to the transistor PT3 exceeds the potential difference between HVSS and HVDD, therefore, voltages smaller than this potential difference are applied between the sources and the drains corresponding to the gates 91 and 92 of the transistor PT3 respectively. Thus, the p-channel transistor PT3 is inhibited from deterioration of properties resulting from application of a bias voltage exceeding the potential difference between HVSS and HVDD, whereby the liquid crystal display including the H driver 4 having the shift register circuits 4a1 to 4a3 can be inhibited from reduction of the scanning property resulting from application of a bias voltage exceeding the potential difference between HVSS and HVDD to the transistor PT3.

According to the first embodiment, further, the transistor PT4 connected between the gate of the P-channel transistor PT1 and the clock signal line (HCLK) is also so constituted as to have the two gate electrodes 91 and 92 electrically connected with each other, to be inhibited from deterioration of properties also when the bias voltage applied thereto exceeds the potential difference between HVSS and HVDD, similarly to the aforementioned transistor PT3. Consequently, the liquid crystal display including the H driver 4 having the shift register circuits 4a1 to 4a3 can also be inhibited from deterioration of the scanning property resulting from deterioration of the properties of the transistor PT4.

According to the first embodiment, in addition, all of the transistors PT1 to PT4 provided on the $1^{st}$ and $2^{nd}$ first circuits 4b1 and 4c1 respectively and the transistors constituting the capacitors C1 are constituted of TFTs (thin-film transistors) consisting of p-type MOS (metal oxide semiconductor) field-effect transistors, whereby the numbers of ion implantation processes and ion implantation masks can be reduced as compared with a case of forming shift register circuits each including transistors of two conductivity types. Thus, a manufacturing process can be simplified and a fabrication cost can be reduced. Further, the p-type MOS field-effect transistors may not be brought into an LDD (lightly doped drain) structure dissimilarly to n-type MOS field-effect transistors, whereby the manufacturing process can be further simplified.

Second Embodiment

Figure 5:
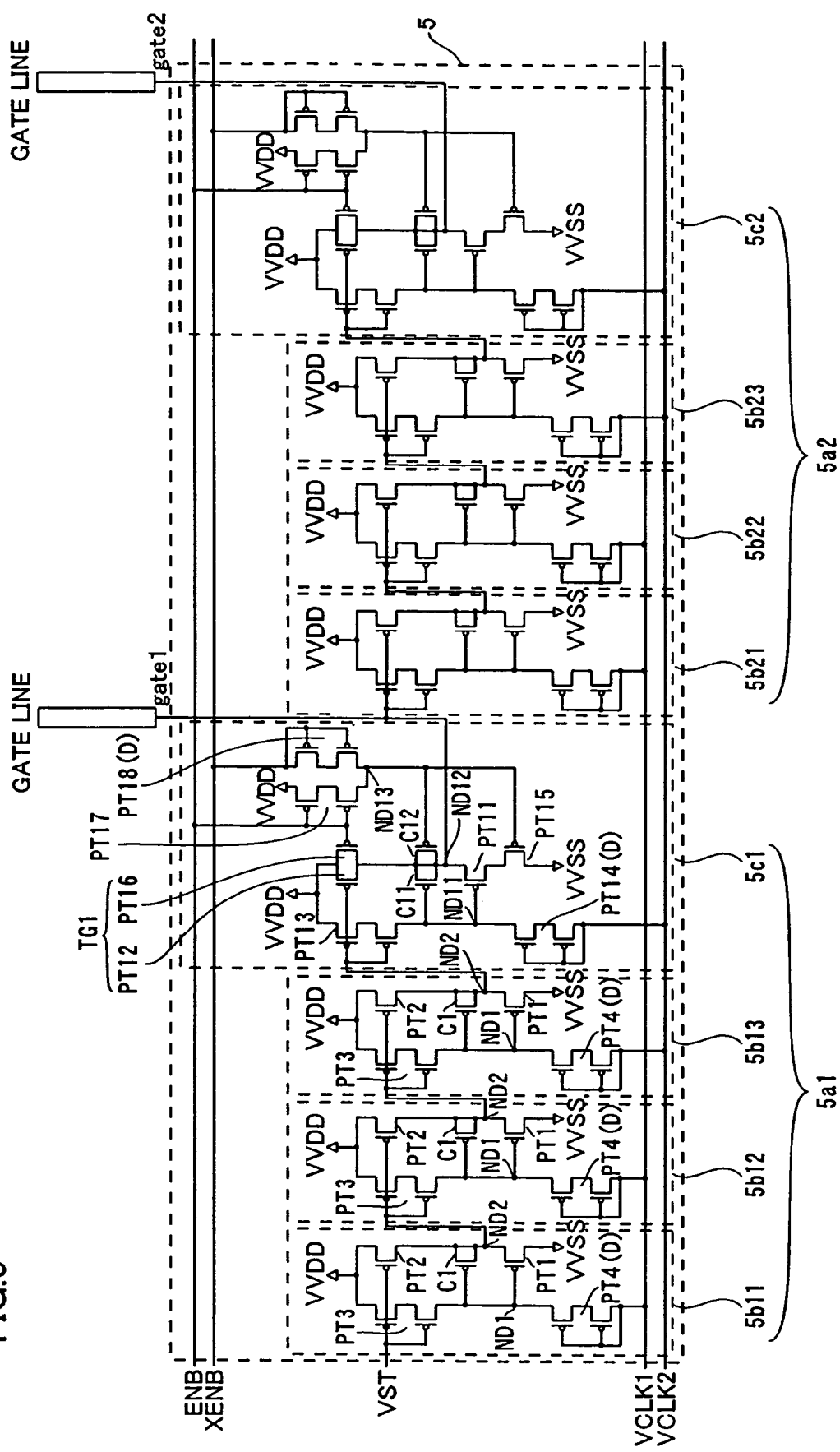
FIG. 5 is a circuit diagram of shift register circuits constituting a V driver of a liquid crystal display according to a second embodiment of the present invention.

Referring to FIG. 5, the present invention is applied to a V driver 5 for driving (scanning) gate lines in a liquid crystal display according to a second embodiment of the present invention, dissimilarly to the aforementioned first embodiment.

As shown in FIG. 5, the V driver 5 of the liquid crystal display according to the second embodiment is provided with a plurality of stages of shift register circuits 5a1 and 5a2. FIG. 5 shows only two shift register circuits 5a1 and 5a2, for simplifying the illustration. The first-stage shift register circuit 5a1 is constituted of $1^{st}$, $2^{nd}$ and $3^{rd}$ first circuit parts 5b11, 5b12 and 5b13 and a second circuit part 5c1. The $1^{st}$ first circuit part 5b11 includes transistors PT1, PT2 and PT3, a diode-connected transistor PT4 and a capacitor C1 formed by connecting the source and the drain of a transistor with each other. The $2^{nd}$ circuit part 5c1 includes transistors PT11, PT12, PT13 and PT14 and a capacitor C11 corresponding to the transistors PT1, PT2, PT3 and PT4 and the capacitor C1 of the aforementioned $1^{st}$ first circuit part 5b11 respectively. The transistors PT11, PT12, PT13 and PT14 are examples of the "first transistor", "second transistor", "third transistor" and "fourth transistor" in the present invention respectively. The second circuit part 5c1 further includes transistors PT15, PT16 and PT17, a diode-connected transistor PT18 and another capacitor C12 formed by connecting the source and the drain of a transistor with each other, dissimilarly to the aforementioned $1^{st}$ first circuit part 5b11.

According to the second embodiment, all of the transistors PT1 to PT4 and PT11 to PT18 provided on the $1^{st}$ and $2^{nd}$ first circuit parts 5b11 and 5c1 respectively and the transistors constituting the capacitors C1, C11 and C12 are constituted of TFTs (thin-film transistors) consisting of p-type MOS (metal oxide semiconductor) field-effect transistors.

According to the second embodiment, further, each of the transistors PT3, PT4, PT13, PT14, PT17 and PT18 is formed to have two gate electrodes electrically connected with each other, similarly to the first embodiment shown in FIG. 3.

As shown in FIG. 5, the transistor PT1 of the $1^{st}$ first circuit part 5b11 has a source connected to a node ND2, a drain connected to a negative potential VVSS and a gate connected with another node ND1 and supplied with a clock signal VCLK1. The transistor PT2 has a source connected to a positive potential VVDD, a drain connected to the node ND2 and a gate supplied with a start signal VST.

According to the second embodiment, the transistor PT3 is connected between the gate of the transistor PT1 and the positive potential VVDD. The gate of this transistor PT3 is supplied with the start signal VST. The transistor PT3 is provided for turning off the transistor PT1 when the transistor PT2 is in an OFF state. Thus, the transistors PT2 and PT1 are inhibited from entering ON states at the same time.

According to the second embodiment, the capacitor C1 is connected between the gate and the source of the transistor PT1. The transistor PT4 is connected between the gate of the transistor PT1 and a clock signal line (VCLK1). This transistor PT4 inhibits a high-level pulse voltage of the clock signal VCLK1 from flowing back from the clock signal line (VCLK1) to the capacitor C1.

The $2^{nd}$ and $3^{rd}$ first circuit parts 5b12 and 5b13 are similar in circuit structure to the aforementioned $1^{st}$ first circuit part 5b11. The $1^{st}$, $2^{nd}$ and $3^{rd}$ first circuit parts 5b11, 5b12 and 5b13 are serially connected with each other. The second circuit part 5c1 is connected to a node ND2 of the $3^{rd}$ first circuit part 5b13.

In the second circuit part 5c1, the transistors PT11, PT12, PT13 and PT13 and the capacitor C11 are basically connected to positions corresponding to the transistors PT1, PT2, PT3 and PT4 and the capacitor C1 of the $1^{st}$ first circuit part 5b11 respectively. In the second circuit part 5c1, however, the drains of the transistors PT11 and PT12 are connected to a node ND12 respectively while the gate of the transistor PT11 is connected to another node ND11.

The transistor PT15 is connected between the negative potential VVSS and the transistor PT11. The gate of this transistor PT15 is connected to a node ND13 and supplied with an inverted enable signal XENB. The capacitor C12 is connected between the gate and the source of the transistor PT15. The transistor PT16 constitutes a transfer gate TG1 along with the transistor PT12.

The transistor PT17 has a source connected to the positive potential VVDD, a drain connected to the node ND13 and a gate supplied with an enable signal ENB. The transistor PT18 is connected between the gate of the transistor PT15 and an inverted enable signal line (XENB).

The node ND12 (output node) outputs an output signal gate1 of the first-stage shift register circuit 5a1. A gate line is connected to this node ND12. The second-stage shift register circuit 5a2 is also connected to the node ND12.

The second-stage shift register circuit 5a2 is constituted of $1^{st}$, $2^{nd}$ and $3^{rd}$ first circuit parts 5b21, 5b22 and 5b23 and a second circuit part 5c2. The $1^{st}$, $2^{nd}$ and $3^{rd}$ first circuit parts 5b21, 5b22 and 5b23 of the second-stage shift register circuit 5a2 are similar in circuit structure to the $1^{st}$ first circuit part 5b11 of the aforementioned first-stage shift register circuit 5a1 respectively. The second circuit part 5c2 of the second-stage shift register circuit 5a2 is also similar in circuit structure to the second circuit part 5c1 of the aforementioned first-stage shift register circuit 5a1. An output node of the second-stage shift register circuit 5a2 outputs an output signal gate2. Another gate line is connected to the output node of the second-stage shift register circuit 5a2. A third-stage shift register circuit (not shown) is also connected to the output node of the second-stage shift register circuit 5a2. The third-stage shift register circuit and those subsequent thereto are also similar in circuit structure to the aforementioned first-stage shift register circuit 5a1.

Figure 6:
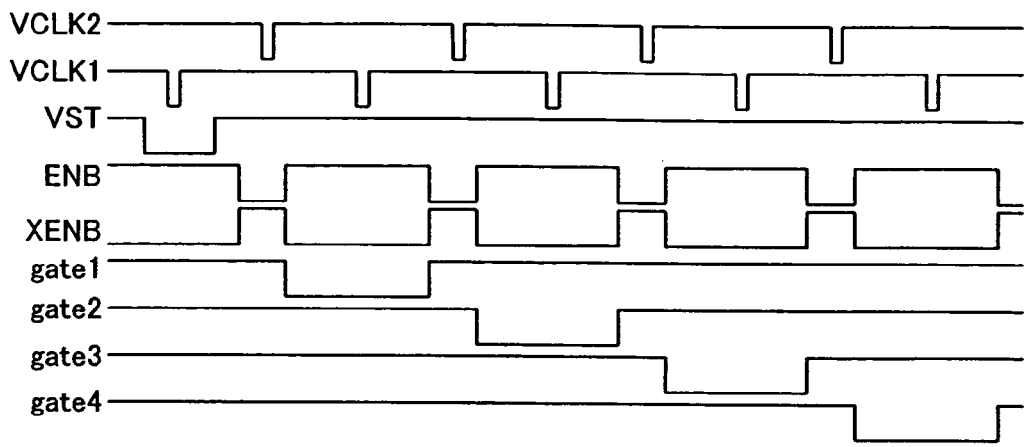
FIG. 6 is a timing chart of the shift register circuits constituting the V driver of the liquid crystal display according to the second embodiment shown in FIG. 5.

Operations of the shift register circuits of the V driver 5 of the liquid crystal display according to the second embodiment are described with reference to FIGS. 5 and 6. Referring to FIG. 6, symbols gate1, gate2, gate3 and gate4 denote output signals output from the first-, second-, third- and fourth-stage shift register circuits to the gate lines respectively.

The structures of the $1^{st}$ and $2^{nd}$ first circuit parts 5b11 and 5b12 of the first-stage shift register circuit 5a1 according to the second embodiment shown in FIG. 5 correspond to those obtained by removing the high-resistance resistors R1 from the $1^{st}$ and $2^{nd}$ first circuit parts 4b1 and 4c1 of the first-stage shift register circuit 4a1 according to the first embodiment shown in FIG. 1 respectively. Therefore, operations of the $1^{st}$ and $2^{nd}$ first circuit parts 5b11 and 5b12 of the first-stage shift register circuit 5a1 according to the second embodiment in response to the start signal VST and the clock signal VCLK1 correspond to those of the $1^{st}$ and $2^{nd}$ first circuit parts 4b1 and 4c1 of the first-stage shift register circuit 4a1 according to the first embodiment shown in FIG. 2 in response to the start signal HST and the clock signal HCLK1 respectively.

In the initial state, the start signal VST of a high level (VVDD) is input in the $1^{st}$ first circuit part 5b11 of the first-stage shift register circuit 5a1. Thus, the 2$^{nd}$ first circuit part 5b12 outputs a high-level signal through an operation similar to that of the H driver 4 in the aforementioned first embodiment. This high-level signal is input in the gates of the transistors PT2 and PT3 of the 3$^{rd}$ first circuit part 5b13. Thus, the transistors PT2 and PT3 of the 3$^{rd}$ first circuit part 5b13 are turned off, whereby the 3$^{rd}$ first circuit part 5b13 outputs a low-level signal.

The low-level signal from the 3$^{rd}$ first circuit part 5b13 is input in the gate of the transistor PT13 and the first gate of the transfer gate TG1 in the second circuit part 5c1. Thus, the transistor PT13 and the transfer gate TG1 of the second circuit part 5c1 are turned on, whereby the potential of the node ND12 goes high. In the initial state, therefore, the first-stage shift register circuit 5a1 outputs the output signal gate1 of a high level to the gate line.

When the start signal VST of a low level (VVSS) is input in this state, the 2$^{nd}$ first circuit part 5b12 outputs a high-level signal through an operation similar to that of the H driver 4 according to the aforementioned first embodiment, whereby the first shift register circuit 5a1 continuously outputs the high-level output signal gate1 to the gate line similarly to the initial state.

When the clock signal VCLK1 of a low level (VVSS) is input, the 2$^{nd}$ first circuit part 5b12 outputs a low-level signal through an operation similar to that of the H driver 4 according to the aforementioned first embodiment. This low-level signal is input in the gates of the transistors PT2 and PT3 of the 3$^{rd}$ first circuit part 5b13, thereby turning on the transistors PT2 and PT3. At this time, the transistor PT1 of the 3$^{rd}$ first circuit part 5b13 is in an OFF state, whereby the 3$^{rd}$ first circuit part 5b13 outputs a high-level signal. This high-level signal is input in the gate of the transistor PT13 and the first gate of the transfer gate TG1 in the second circuit part 5c1. At this time, the enable signal ENB is maintained at a high level (VVDD), thereby turning off the transfer gate TG1. The node ND11 maintained at a high level enters a floating state, thereby maintaining the transistor PT11 also in the OFF state. Thus, the first-stage shift register circuit 5a1 continuously outputs the high-level output signal gate1 to the gate line.

Also when the start signal VST of a high level (VVDD) is thereafter input, the 2$^{nd}$ first circuit part 5b12 continuously outputs the low-level signal through an operation similar to that of the H driver 4 according to the aforementioned first embodiment. Thus, the first-stage shift register circuit 5a1 continuously outputs the high-level output signal gate1 to the gate line.

Then, the enable signal ENB and the inverted enable signal XENB go low (VVSS) and high (VVDD) respectively. Thus, the transfer gate TG1 receiving the low-level enable signal ENB is turned on in the second circuit part 5c1. The low-level enable signal ENB is also input in the gate of the transistor PT17, thereby turning on the transistor PT17. Thus, the potential of the node ND13 goes high, thereby turning off the transistor PT15 having the gate connected to this node ND13. Therefore, the potential of the node ND12 goes high, whereby the first-stage shift register circuit 5a1 continuously outputs the high-level output signal gate1 to the gate line.

Then, the clock signal VCLK2 of a low level (VVSS) is input through the transistor PT4 of the 3$^{rd}$ first circuit part 5b13 while the enable signal ENB is at the low level (VVSS). At this time, the transistors PT2 and PT3 of the 3$^{rd}$ first circuit part 5b13 are in ON states, thereby maintaining the potential of the node ND1 at a high level. Thus, the transistor PT1 of the 3$^{rd}$ first circuit part 5b13 is turned off so that the 3$^{rd}$ first circuit part 5b13 outputs a high-level signal. This high-level signal is input in the gate of the transistor PT13 and the first gate of the transfer gate TG1 in the second circuit part 5c1. Thus, the transistor PT13 is maintained in the OFF state. On the other hand, the second gate of the transfer gate TG1 receives the low-level enable signal ENB, thereby maintaining the transfer gate TG1 in the ON state.

The clock signal VCLK2 of the low level (VVSS) is also input in the second circuit part 5c1 through the transistor PT14. Thus, the potential of the node ND11 goes low, thereby turning on the transistor PT11. However, the p-channel transistor PT17 is maintained in the ON state due to the low-level enable signal ENB. Therefore, the transistor PT15 is maintained in the OFF state, for maintaining the node ND12 at a high level as a result. Thus, the first-stage shift-register circuit 5a1 maintains the high-level output signal gate1 toward the gate line in this state.

Thereafter the enable signal ENB and the inverted enable signal XENB go high (VVDD) and low (VVSS) respectively, thereby turning off the transfer gate TG1 and the transistor PT17. The transistor PT15 receiving the low-level inverted enable signal XENB in the gate through the transistor PT18 is turned on.

At this time, the potential of the node ND13 is lower than the VVSS due to the function of the capacitor C12. Therefore, a bias voltage applied to the transistor PT17 connected to the positive potential VVDD exceeds the potential difference between VVDD and VVSS. When the inverted enable signal XENB goes high (VVDD), a bias voltage applied to the transistor PT18 connected to an inverted enable signal line (XENB) also exceeds the potential difference between VVDD and VVSS.

Thus, the transistors PT11 and PT15 are turned on and the transfer gate TG1 is turned off, whereby the potential of the node ND12 goes low to VVSS due to the functions of the capacitors C11 and C12. Therefore, the first-stage shift register circuit 5a1 outputs the output signal gate1 of a low level to the gate line. Also when the clock signal VCLK1 goes low (VVSS) in this state, the first-stage shift register circuit 5a1 maintains the output signal gate1 toward the gate line at the low level.

When the potential of the node ND12 drops to VVSS, the potential of the node ND11 is lower than VVSS. Therefore, the bias voltage applied to the transistor PT13 connected to the positive potential VVDD exceeds the potential difference between WDD and VVSS. When the clock signal VCLK2 goes high (VVDD), further, the bias voltage applied to the transistor PT14 connected to the clock signal line (VCLK2) also exceeds the potential difference between VVDD and VVSS.

Then, the enable signal ENB and the inverted enable signal XENB go low (VVSS) and high (VVDD) respectively, thereby turning on the transfer gate TG1 and the transistor PT17. The potential of the node ND13 goes high due to the ON-state of the transistor PT17. Thus, the transistor PT15 having the gate connected to the node ND13 is turned off. Therefore, the transfer gate TG1 and the transistor PT15 are turned on and off respectively, whereby the potential of the node ND12 goes high. Thus, the first-stage shift register circuit 5a1 outputs the output signal gate1 of a high level to the gate line.

The high-level output signal gate1 from the first-stage shift register circuit 5a1 is also input in the 1$^{st}$ first circuit part 5b21 of the second-stage shift register circuit 5a2. The second-stage shift register circuit 5a2 and those subsequent thereto perform operations similar to those of the aforementioned first-stage shift register circuit 5a1 through output signals from the precedent shift register circuits, the clock signals VCLK1 and VCLK2 and the enable and inverted enable signals ENB and XENB. Thus, the liquid crystal display successively drives (scans) gate lines of the respective stages. In this case, the output of each shift register circuit is forcibly maintained at a high level while the enable signal ENB is at a low level. Therefore, the liquid crystal display allows the enable signal ENB to go low at timings shown in FIG. 6, thereby preventing superposition of low-level output signals from precedent and subsequent shift register circuits.

According to the second embodiment, as hereinabove described, each of the transistors PT3, PT4, PT13, PT14, PT17 and PT18 is formed to have the two gate electrodes electrically connected with each other so that the bias voltage applied to each of the transistors PT3, PT4, PT13, PT14, PT17 and PT18 is distributed between the sources and the drains corresponding to the gate electrodes of each of the transistors PT3, PT4, PT13, PT14, PT17 and PT18 substantially about half-and-half (the voltage distribution ratio varies with the transistor size or the like) also when this bias voltage exceeds the potential difference between VVSS and VVDD, thereby inhibiting the transistors PT3, PT4, PT13, PT14, PT17 and PT18 from deterioration of properties. Consequently, the liquid crystal display including the V driver 5 having the shift register circuits 5a1 and 5a2 can be inhibited from deterioration of the scanning property resulting from deterioration of the properties of the transistors PT3, PT4, PT13, PT14, PT17 and PT18.

The remaining effects of the second embodiment are similar to those of the aforementioned first embodiment.

Third Embodiment

In a liquid crystal display according to a third embodiment of the present invention, an H driver for driving (scanning) drain lines is constituted of n-channel transistors.

Figure 7:
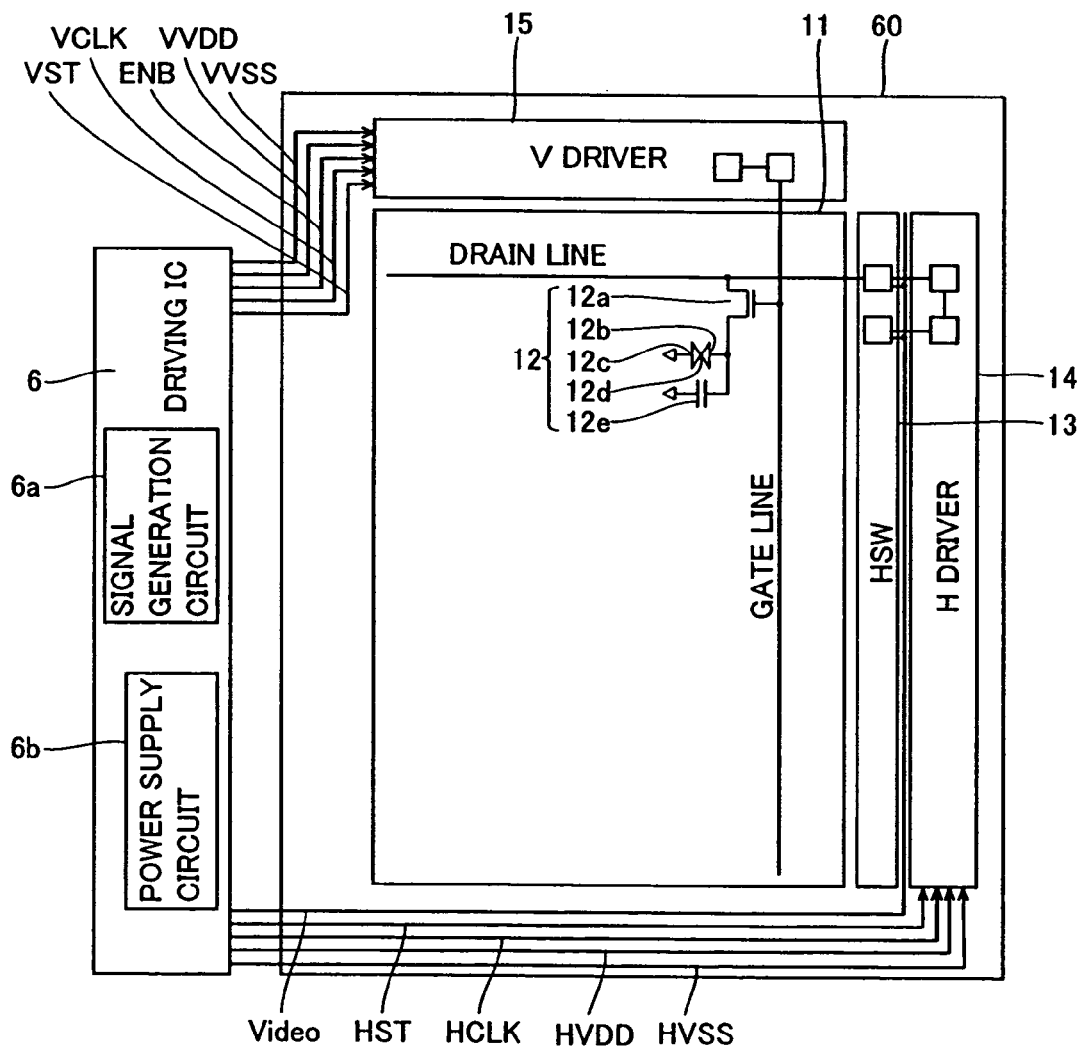
FIG. 7 is a plan view showing a liquid crystal display according to a third embodiment of the present invention.

Referring to FIG. 7, a display part 11 is provided on a substrate 60 in the liquid crystal display according to the third embodiment. FIG. 7 shows the display part 11 in a structure for one pixel 12. Each of the pixels 12 arranged on the display part 11 in the form of a matrix is constituted of an n-channel transistor 12a, a pixel electrode 12b, an opposing electrode (common electrode) 12c, common to the respective pixels 12, arranged oppositely to the pixel electrode 12b, a liquid crystal 12d held between the pixel electrode 12b and the common electrode 12c and a storage capacitor 12e. The n-channel transistor 12a has a source connected to the pixel electrode 12b and the storage capacitor 12e, a drain connected to a drain line and a gate connected to a gate line. A horizontal switch (HSW) 13 and an H driver 14 for driving (scanning) drain lines of the display part 11 are provided on the substrate 60 along one side of the display part 11. A V driver 15 for driving (scanning) gate lines of the display part 11 is provided on the substrate 60 along another side of the display part 11. The horizontal switch 13, including only two switching elements in FIG. 7, has switching elements arranged in a number responsive to that of the pixels 12. Further, each of the H and V drivers 14 and 15, constituted of only two shift registers in FIG. 7, also has shift registers arranged in the number responsive to that of the pixels 12.

Figure 8:
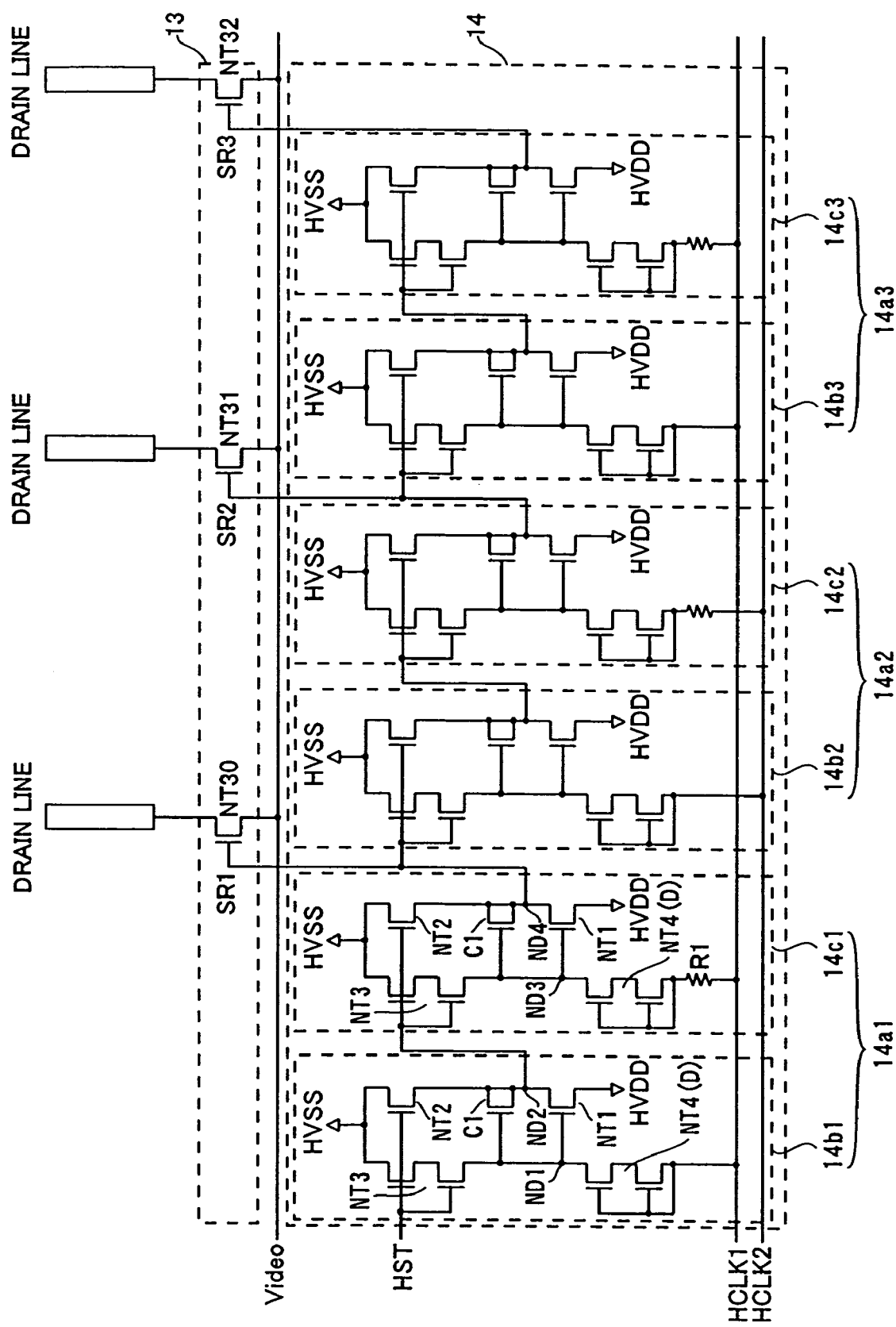
FIG. 8 is a circuit diagram of shift register circuits constituting an H driver of the liquid crystal display according to the third embodiment shown in FIG. 7.

As shown in FIG. 8, the H driver 14 is provided therein with a plurality of stages of shift register circuits 14a1, 14a2 and 14a3. While FIG. 7 shows only three stages of shift register circuits 14a1, 14a2 and 14a3 for simplifying the illustration, such shift registers are provided in the number responsive to that of the pixels 12 in practice. The first-stage shift register circuit 14a1 is constituted of 1$^{st}$ and 2$^{nd}$ first circuit parts 14b1 and 14c1. The 1$^{st}$ first circuit part 14b1 includes n-channel transistors NT1, NT2 and NT3, a diode-connected n-channel transistor NT4 and a capacitor C1 formed by connecting the source and the drain of an n-channel transistor with each other. The 2$^{nd}$ first circuit part 14c1 also includes n-channel transistors NT1, NT2, NT3 and NT4 and a capacitor C1, similarly to the aforementioned 1$^{st}$ first circuit part 14b1. The 2$^{nd}$ first circuit part 14c1 further includes a high-resistance resistor R1, dissimilarly to the aforementioned 1$^{st}$ first circuit part 14b1.

The second-stage shift register circuit 14a2 is constituted of 1$^{st}$ and 2$^{nd}$ first circuit parts 14b2 and 14c2, and the third-stage shift register circuit 14a3 is also constituted of 1$^{st}$ and 2$^{nd}$ first circuit parts 14b3 and 14c3. The second- and third-stage shift register circuits 14a2 and 14a3 are similar in circuit structure to the aforementioned first-stage shift register circuit 14a1.

According to the third embodiment, all of the n-channel transistors NT1 to NT4 provided on the 1$^{st}$ and 2$^{nd}$ first circuit parts 14b1 and 14c1 respectively and the n-channel transistors constituting the capacitors C1 are constituted of TFTs (thin-film transistors) consisting of n-type MOS (metal oxide semiconductor) field-effect transistors. The n-channel transistors NT1 to NT4 are hereinafter also referred to as transistors NT1 to NT4 respectively.

Figure 9:
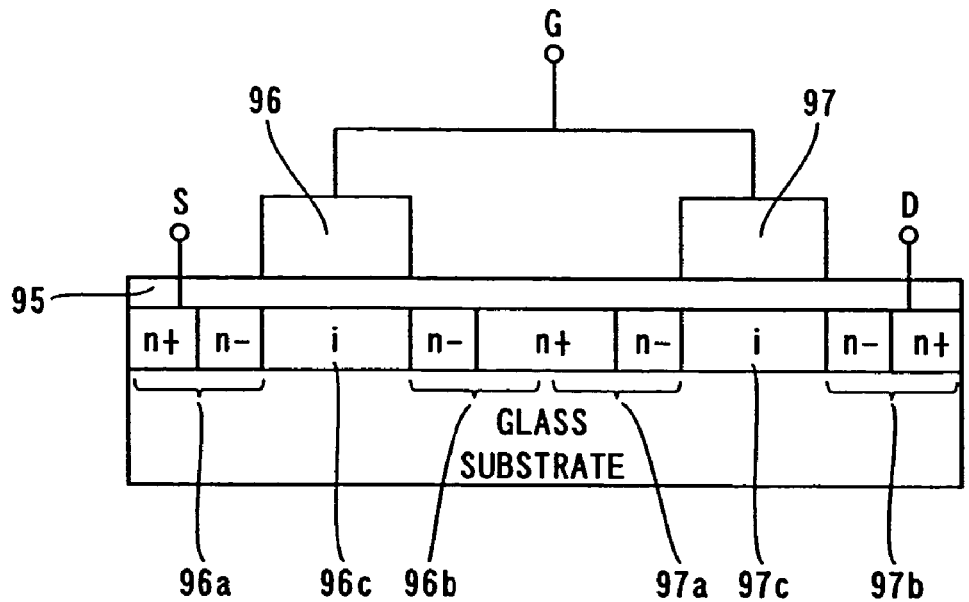
FIG. 9 is a model diagram for illustrating the structure of n-channel transistors each having two gate electrodes.

According to the third embodiment, each of the transistors NT3 and NT4 is formed to have two gate electrodes 96 and 97 electrically connected with each other, as shown in FIG. 9. More specifically, the gate electrodes 96 and 97 are formed on first and second channel regions 96c and 97c through a gate insulator film 95 respectively. The first channel region 96c is held between first source and drain regions 96a and 96b each having an LDD (lightly doped drain) structure including a low-concentration impurity region and a high-concentration impurity region, while the second channel region 97c is held between second source and drain regions 97a and 97b each having the LDD structure. The first drain region 96b and the second source region 97a have a common impurity region.

As shown in FIG. 8, the sources of the transistors NT2 and NT3 are connected to a negative potential HVSS respectively, while the drain of the transistor NT1 is connected to a positive potential HVDD.

The remaining parts of the shift register circuit 14a1 according to the third embodiment are similar in structure to those of the shift register circuit 4a1 (see FIG. 2) according to the aforementioned first embodiment.

The horizontal switch 13 includes a plurality of transistors NT30, NT31 and NT32. The gates of the transistors NT30, NT31 and NT32 are connected to outputs SR1, SR2 and SR3 of the first-, second- and third-stage shift register circuits 14a1, 14a2 and 14a3 respectively. The sources of the transistors NT30 to NT32 are connected to respective stages of drain lines respectively. The drains of the transistors NT30 to NT32 are connected to a video signal line Video. The liquid crystal display has three video signal lines when receiving three types of video signals Video of red (R), green (G) and blue (B), for example.

Figure 10:
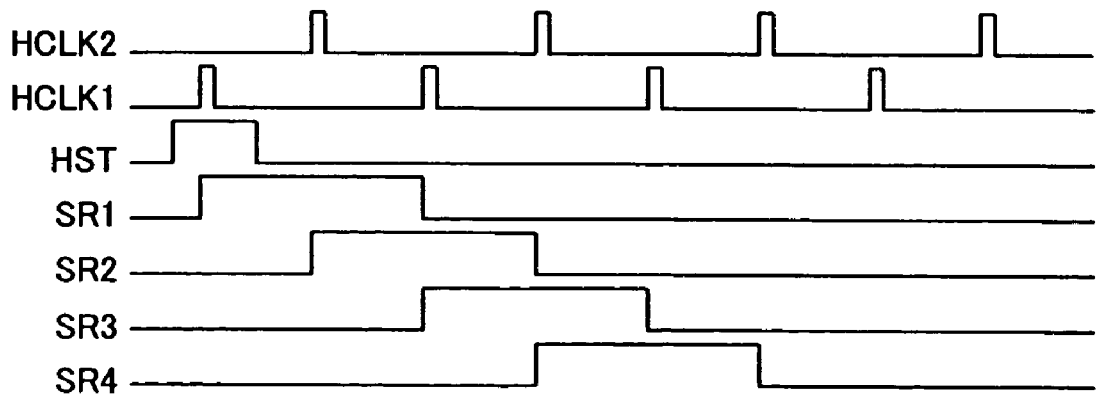
FIG. 10 is a timing chart of the shift register circuits constituting the H driver of the liquid crystal display according to the third embodiment shown in FIG. 8.

Referring to FIG. 10, signals having waveforms obtained by inverting the clock signals HCLK1 and HCLK2 and the high and low levels of the start signal HST in the timing chart for the shift register circuits according to the first embodiment shown in FIG. 4 are input as clock signals HCLK1 and HCLK2 and a start signal HST in the shift register circuits according to the third embodiment respectively. Thus, the shift register circuits of the liquid crystal display according to the third embodiment output signals having waveforms obtained by inverting the high and low levels of the output signals SR1 to SR4 from the shift register circuits according to the first embodiment shown in FIG. 4 respectively. The remaining operations of the shift register circuits according to the third embodiment are similar to those of the shift register circuit 4a1 according to the aforementioned first embodiment.

According to the third embodiment having the aforementioned structure, effects similar to those of the aforementioned first embodiment can be attained for inhibiting the liquid crystal display including the H driver 14 from reduction of the scanning property and increase of current consumption.

Fourth Embodiment

In a liquid crystal display according to a fourth embodiment of the present invention, a V driver 15 for driving (scanning) gate lines is constituted of n-channel transistors.

Figure 11:
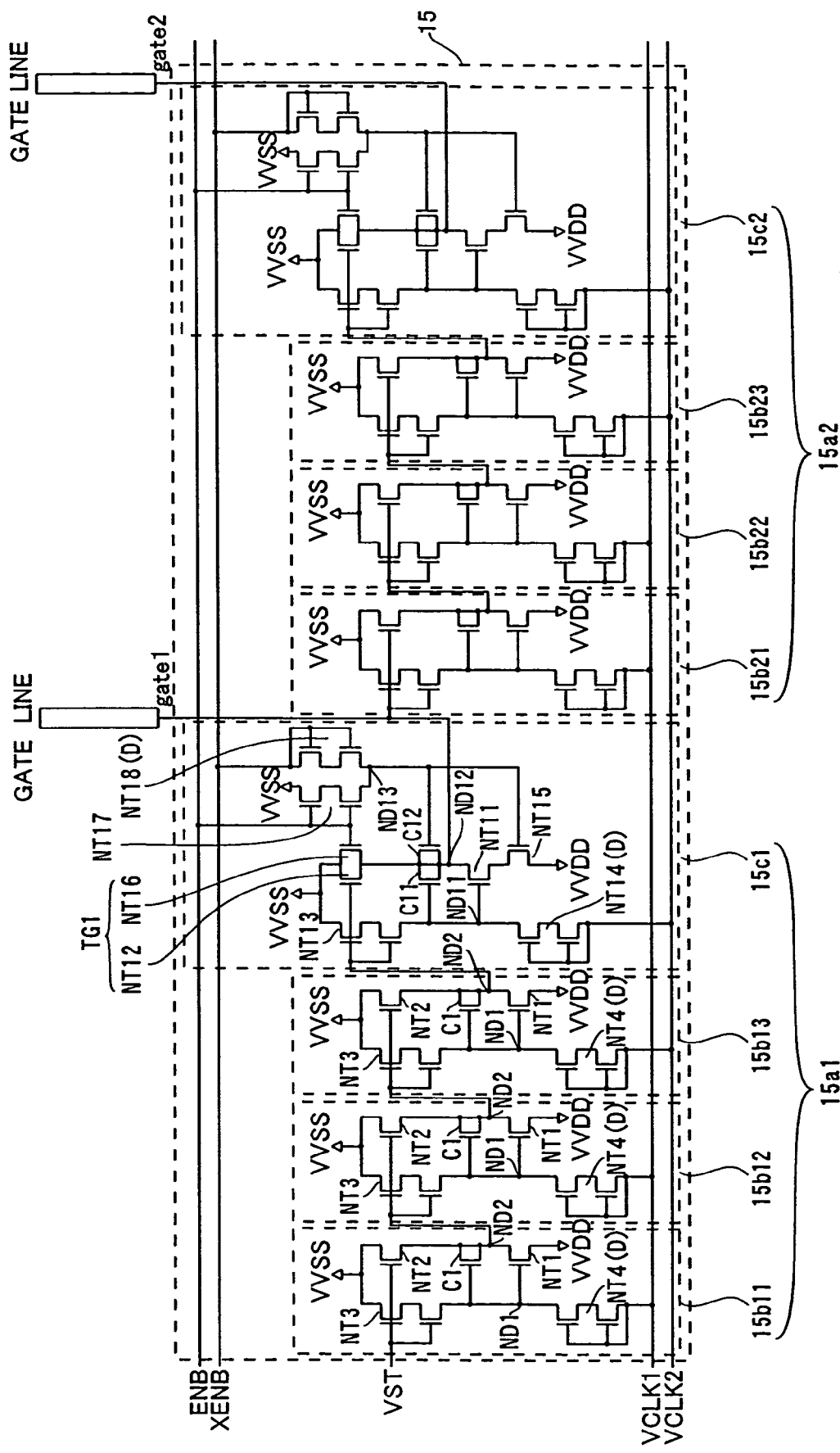
FIG. 11 is a circuit diagram of shift register circuits constituting a V driver of a liquid crystal display according to a fourth embodiment of the present invention.

Referring to FIG. 11, the V driver 15 is provided therein with a plurality of shift register circuits 15a1 and 15a2. FIG. 11 shows only two stages of shift register circuits 15a1 and 15a2, in order to simplify the illustration. The first-stage shift register circuit 15a1 is constituted of $1^{st}$, $2^{nd}$ and $3^{rd}$ first circuit parts 15b11, 15b12 and 15b13 and a second circuit part 15c1.

The $1^{st}$ first circuit part 15b11 includes transistors NT1, NT2 and NT3, a diode-connected transistor NT4 and a capacitor C1 formed by connecting the source and the drain of a transistor with each other. The second circuit part 15c1 of the first-stage shift register 15a includes transistors NT11, NT12, NT13 and NT14 and a capacitor C11 corresponding to the transistors NT1, NT2, NT3 and NT4 and the capacitor C1 of the aforementioned $1^{st}$ first circuit part 15b 11 respectively. The second circuit part 15c1 further includes transistors NT15, NT16 and NT17, a diode-connected transistor NT18 and a capacitor C12 formed by connecting the source and the drain of a transistor with each other, dissimilarly to the aforementioned $1^{st}$ first circuit part 15b11.

The $2^{nd}$ and $3^{rd}$ first circuit parts 15b12 and 15b13 of the first-stage shift register circuit 15a1 are similar in circuit structure to the $1^{st}$ first circuit part 15b11. The second-stage shift register circuit 15a2 is constituted of $1^{st}$, $2^{nd}$ and $3^{rd}$ first circuit parts 15b21, 15b22 and 15b23 and a second circuit part 15c2. The second-stage shift register circuit 15a2 is similar in circuit structure to the aforementioned first-stage shift register circuit 15a1.

According to the fourth embodiment, all of the transistors NT1 to NT4 and NT11 to NT18 provided on the $1^{st}$ and $2^{nd}$ first circuit parts 15b11 and 15c11 respectively and the transistors constituting the capacitors C1, C11 and C12 are constituted of TFTs (thin-film transistors) consisting of n-type MOS (metal oxide semiconductor) field-effect transistors.

According to the fourth embodiment, further, each of the transistors NT3, NT4, NT13, NT14, NT17 and NT18 is formed to have two gate electrodes electrically connected with each other, similarly to the third embodiment shown in FIG. 9.

As shown in FIG. 11, the sources of the transistors NT2, NT3, NT12, NT13, NT16 and NT17 are connected to a negative potential VVSS respectively while the drains of the transistors NT1 and NT15 are connected to a positive potential VVDD respectively.

The remaining portions of the shift register circuits 15a1 and 15a2 according to the fourth embodiment are similar in structure to those of the shift register circuit 5a1 (see FIG. 5) according to the aforementioned second embodiment.

Figure 12:
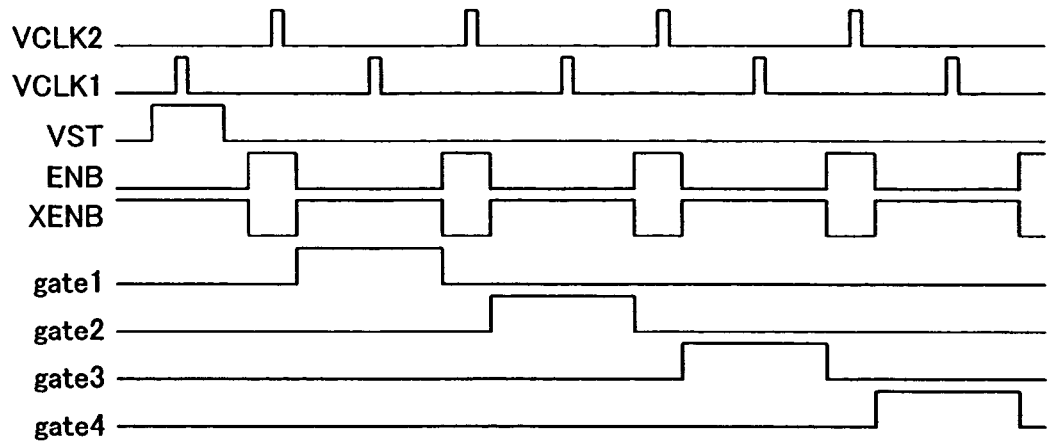
FIG. 12 is a timing chart of the shift register circuits constituting the V driver of the liquid crystal display according to the fourth embodiment shown in FIG. 11.

Referring to FIG. 12, signals having waveforms obtained by inverting the clock signals VCLK1 and VCLK2 and the high and low levels of the start signal VST in the timing chart for the shift register circuits according to the second embodiment shown in FIG. 6 are input as clock signals VCLK1 and VCLK2 and a start signal VST in the shift register circuits according to the fourth embodiment respectively. Thus, the shift register circuits of the liquid crystal display according to the fourth embodiment output signals having waveforms obtained by inverting the high and low levels of the output signals gate1 to gate4 from the shift register circuits according to the second embodiment shown in FIG. 6 respectively. The remaining operations of the shift register circuits according to the fourth embodiment are similar to those of the shift register circuit 5a1 according to the aforementioned second embodiment.

According to the fourth embodiment having the aforementioned structure, effects similar to those of the aforementioned second embodiment can be attained for inhibiting the liquid crystal display including the V driver 15 from reduction of the scanning property and increase of current consumption.

Fifth Embodiment

Figure 13:
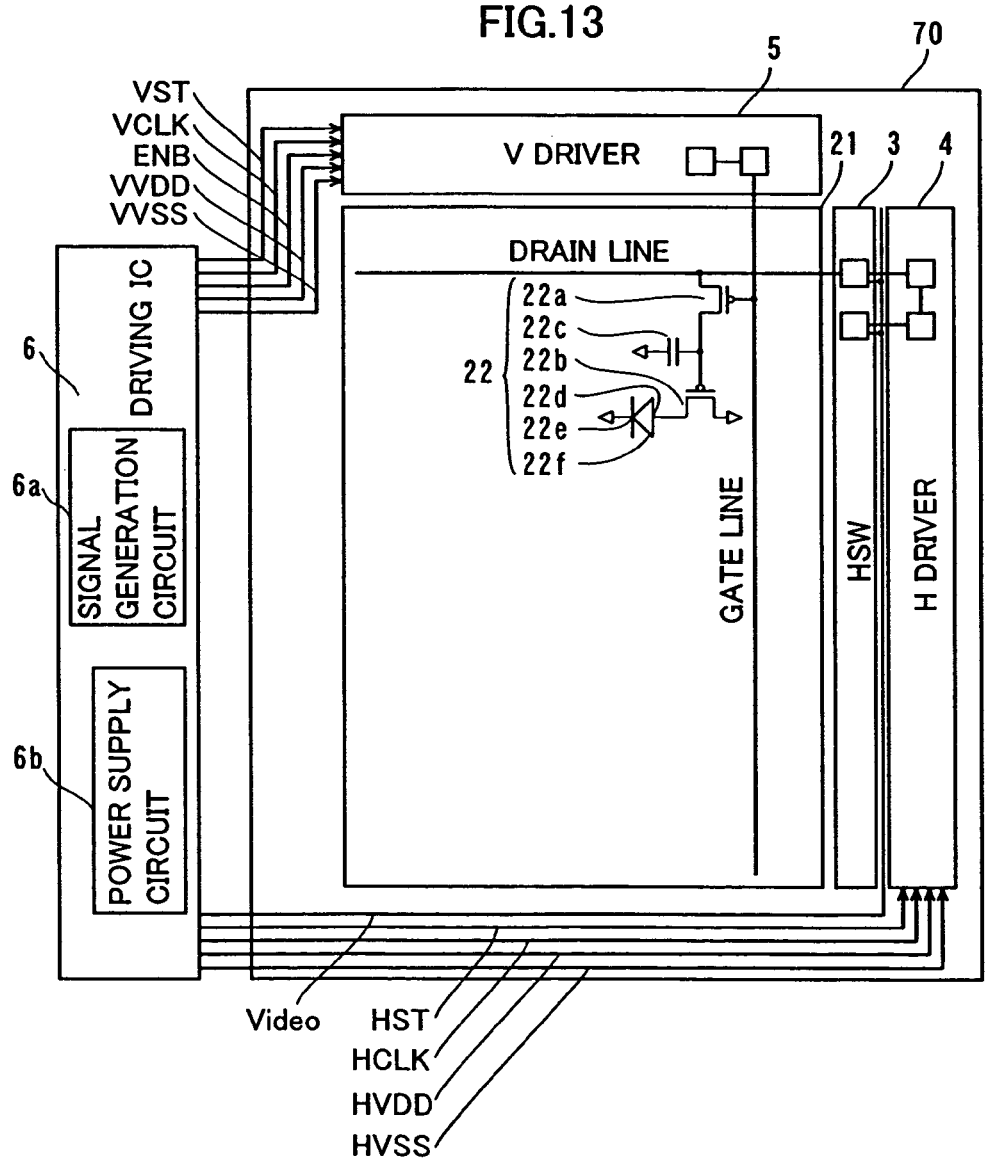
FIG. 13 is a plan view showing an organic EL display according to a fifth embodiment of the present invention.

Referring to FIG. 13, a fifth embodiment of the present invention is applied to an organic EL display.

In the organic EL display according to the fifth embodiment, a display part 21 is provided on a substrate 70, as show in FIG. 13. FIG. 13 illustrates the display part 21 in a structure for one pixel 22. Each of the pixels 22 arranged on the display part 21 in the form of a matrix is constituted of two p-channel transistors (hereinafter also referred to as transistors) 22a and 22b, a storage capacitor 22c, an anode 22d, a cathode 22e and an organic EL element 22f held between the anode 22a and the cathode 22e. The transistor 22a has a gate connected to a gate line, a source connected to a drain line and a drain connected with the storage capacitor 22c and the gate of the transistor 22b. The drain of the transistor 22b is connected to the anode 22d. An H driver 4 has an internal circuit structure similar to that of the H driver 4 constituted of the shift registers 4a1, 4a2 and 4a3 employing the p-channel transistors PT1 to PT4 shown in FIG. 2. A V driver 5 also has an internal circuit structure similar to that of the V driver 5 constituted of the shift register circuits 5a1 and 5a2 employing the transistors PT11 to PT14 shown in FIG. 5. The remaining portions of the organic EL display according to the fifth embodiment are similar in structure to those of the liquid crystal display according to the first embodiment shown in FIG. 1.

According to the fifth embodiment having the aforementioned structure, effects similar to those of the aforementioned first and second embodiments can be attained for inhibiting the organic EL display including the H driver 4 and the V driver 5 from reduction of the scanning property and increase of current consumption.

Sixth Embodiment

Figure 14:
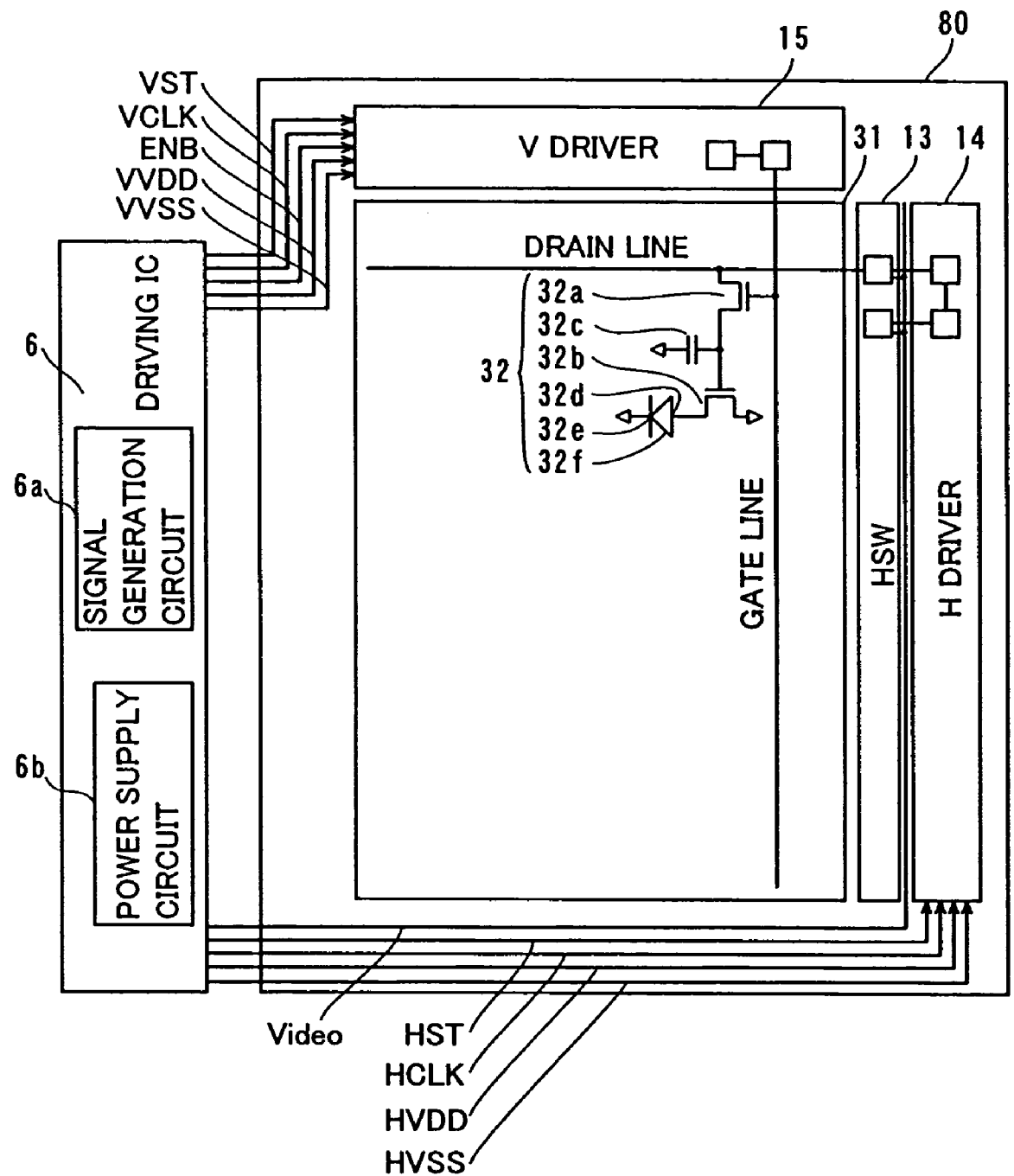
FIG. 14 is a plan view showing an organic EL display according to a sixth embodiment of the present invention.

Referring to FIG. 14, a sixth embodiment of the present invention is applied to an organic EL display.

In the organic EL display according to the sixth embodiment, a display part 31 is provided on a substrate 80, as show in FIG. 14. FIG. 14 illustrates the display part 31 in a structure for one pixel 32. Each of the pixels 32 arranged on the display part 31 in the form of a matrix is constituted of two n-channel transistors (hereinafter also referred to as transistors) 32a and 32b, a storage capacitor 32c, an anode 32d, a cathode 32e and an organic EL element 32f held between the anode 32d and the cathode 32e. The transistor 32a has a gate connected to a gate line, a drain connected to a drain line and a source connected with the storage capacitor 32c and the gate of the transistor 32b. The source of the transistor 32b is connected to the anode 32d. An H driver 14 has an internal circuit structure similar to that of the H driver 14 constituted of the shift registers 14a1, 14a2 and 14a3 employing the n-channel transistors NT1 to NT4 shown in FIG. 8. A V driver 15 also has an internal circuit structure similar to that of the V driver 15 constituted of the shift register circuits 15a1 and 15a2 having the n-channel transistors NT11 to NT14 shown in FIG. 11. The remaining portions of the organic EL display according to the sixth embodiment are similar in structure to those of the liquid crystal display according to the third embodiment shown in FIG. 7.

According to the sixth embodiment having the aforementioned structure, effects similar to those of the aforementioned third and fourth embodiments can be attained for inhibiting the organic EL display including the H driver 14 and the V driver 15 from reduction of the scanning property and increase of current consumption.

Seventh Embodiment

Figure 15:
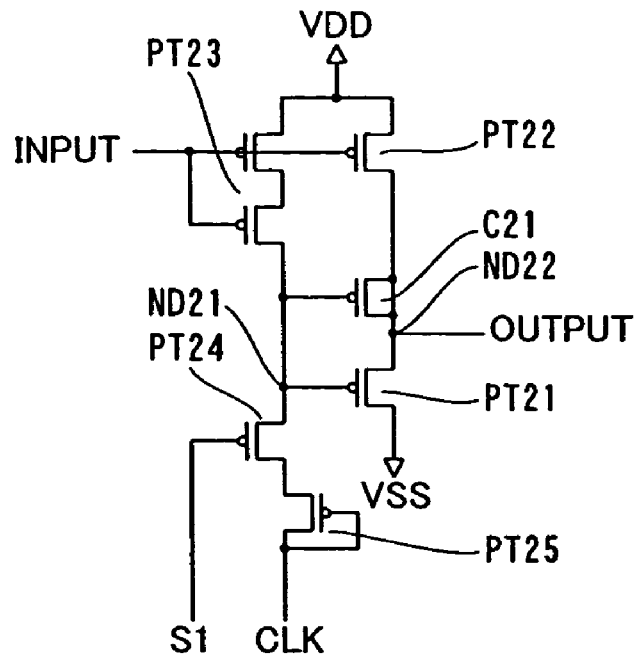
FIG. 15 is a circuit diagram showing each first circuit part of each of shift register circuits constituting an H driver and a V driver of a liquid crystal display according to a seventh embodiment of the present invention.

Referring to FIG. 15, a liquid crystal display according to a seventh embodiment of the present invention has shift register circuits, each of which can inhibit deterioration of the scanning property resulting from application of a bias voltage larger than the potential difference between VDD and VSS to a prescribed transistor while suppressing a penetration current.

As shown in FIG. 15, each first circuit part of each of shift register circuits constituting H and V drivers of the liquid crystal display according to the seventh embodiment includes transistors PT21, PT22, PT23 and PT24, a diode-connected transistor PT25 and a capacitor C21 formed by connecting the source and the drain of a transistor with each other. The transistors PT21, PT22, PT23 and PT24 are examples of the "first transistor", "second transistor", "third transistor" and "fourth transistor" in the present invention respectively.

According to the seventh embodiment, all of the transistors PT21 to PT25 and the transistor constituting the capacitor C21 are constituted of TFTs (thin-film transistors) consisting of p-type MOS (metal oxide semiconductor) field-effect transistors.

According to the seventh embodiment, the transistor PT23 is formed to have two gate electrodes electrically connected with each other, similarly to the first embodiment shown in FIG. 3.

As shown in FIG. 15, the transistor PT21 has a source connected to a node ND22, a drain connected to the negative potential VSS and a gate connected to another node ND21 and supplied with a clock signal CLK. The transistor PT22 has a source connected to the positive potential VDD, a drain connected to the node ND22 and a gate supplied with an input signal.

According to the seventh embodiment, the transistor PT23 is connected between the gate of the transistor PT23 and the positive potential VDD. The gate of the transistor PT23 is supplied with the input signal. The transistor PT23 is provided for turning off the transistor PT21 when the transistor PT22 is in an ON state. Thus, the transistors PT22 and PT21 are inhibited from entering ON states at the same time. The capacitor C21 is connected between the gate and the source of the transistor PT21.

According to the seventh embodiment, the transistor PT24 is connected between the gate of the transistor PT21 and a clock signal line (CLK). The gate of this transistor PT24 is supplied with a signal S1 obtaining an ON-state period not overlapping with that of the transistor PT23. The transistor PT25 is connected between the gate of the transistor PT21 and the clock signal line (CLK).

In operation of each shift register circuit of the liquid crystal display according to the seventh embodiment, the input signal goes high to turn off the transistors PT22 and PT23. The clock signal CLK goes low to turn on the transistor PT25. At this time, the gate of the transistor PT24 is supplied with the signal S1 (low level) obtaining the ON-state period not overlapping with that of the transistor PT23. Thus, the transistor PT24 is turned on and the potential of the node ND21 goes low, thereby turning on the transistor PT21. AT this time, the potential of the node ND22 drops toward VSS.

In this case, the potential of the node ND21 (the gate potential of the transistor PT21) drops following reduction of the potential of the node ND22 (the source potential of the transistor PT21), so that the capacitor C21 maintains the gate-to-source voltage of the p-channel transistor PT21. The transistor PT23 is in an OFF state and no high-level signal from the clock signal (CLK) flows back toward the node ND21 in the diode-connected transistor PT25, whereby the holding voltage of the capacitor C21 (the gate-to-source voltage of the transistor PT21) is maintained. Thus, the transistor PT21 is regularly maintained in the ON state during reduction of the potential of the node ND22, whereby the potential of the node ND22 drops to VSS. Consequently, the shift register circuit outputs a low-level output signal.

When the potential of the node ND22 drops to VSS, the potential of the node ND21 is lower than VSS. Thus, a bias voltage applied to the transistor PT23 connected to the positive potential VDD exceeds the potential difference between VDD and VSS.

Thereafter the input signal goes low to turn on the transistors PT22 and PT23. According to the seventh embodiment, the transistor PT24 is turned off at this time. In other words, the transistors PT23 and PT24 are not turned on at the same time. Thus, the potential of the node ND21 goes high and the transistor PT21 is turned off. Consequently, the potential of the node ND22 goes up to VDD and the shift register circuit outputs a high-level output signal.

According to the seventh embodiment, as hereinabove described, the transistor PT24 turned on in response to the signal S1 obtaining the ON-state period not overlapping with that of the transistor PT23 is connected between the gate of the transistor PT21 and the clock signal line (CLK) so that the transistors PT23 and PT24 are not turned on at the same time, whereby a penetration current can be prevented from flowing between VDD and the clock signal line (CLK) through the transistors PT23 and PT24.

According to the seventh embodiment, further, the transistor PT23 is formed to have the two gate electrodes electrically connected with each other, thereby distributing a voltage applied to the transistor PT23 between sources and drains corresponding to the gate electrodes respectively substantially about half-and-half (the voltage distribution ratio varies with the transistor size or the like) also when the bias voltage exceeds the potential difference between VSS and VDD and inhibiting the transistor PT23 from deterioration of properties. Consequently, the liquid crystal display can suppress increase of power consumption while suppressing reduction of the scanning property resulting from deterioration of the properties of the transistor PT23.

Eighth Embodiment

In a liquid crystal display according to an eighth embodiment of the present invention, n-channel transistors are employed in place of p-channel transistors in a structure similar to that according to the aforementioned seventh embodiment.

Figure 16:
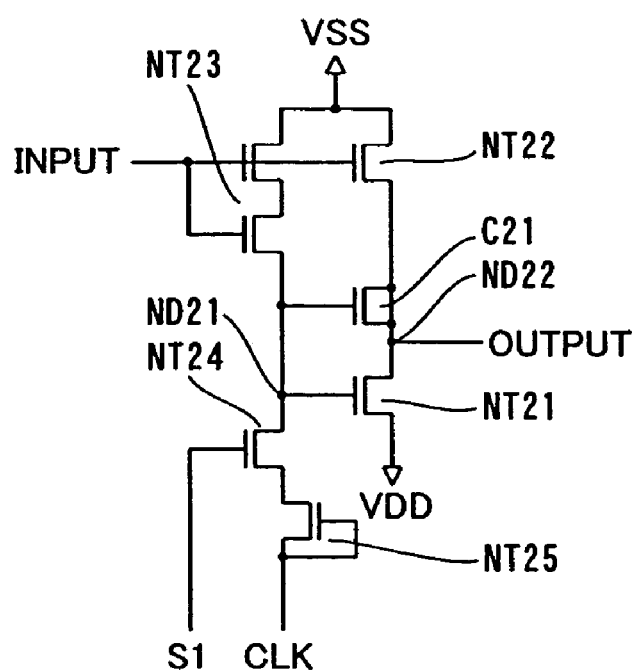
FIG. 16 is a circuit diagram showing each first circuit part of each of shift register circuits constituting an H driver and a V driver of a liquid crystal display according to an eighth embodiment of the present invention.

As shown in FIG. 16, each first circuit part of each of shift register circuits constituting H and V drivers of the liquid crystal display according to the eighth embodiment includes transistors NT21, NT22, NT23 and NT24, a diode-connected transistor NT25 and a capacitor C21 formed by connecting the source and the drain of a transistor with each other.

According to the eighth embodiment, all of the transistors NT21 to NT25 and the transistor constituting the capacitor C21 are constituted of TFTs (thin-film transistors) consisting of n-type MOS (metal oxide semiconductor) field-effect transistors.

According to the eighth embodiment, further, the transistor NT23 is formed to have two gate electrodes electrically connected with each other, similarly to the third embodiment shown in FIG. 9.

As shown in FIG. 16, the sources of the transistors NT22 and NT23 are connected to a negative potential VSS respectively, while the drain of the transistor NT21 is connected to a positive potential VDD.

The remaining structure of the eighth embodiment is similar to that of the aforementioned seventh embodiment.

According to the eighth embodiment having the aforementioned structure, the liquid crystal display can suppress increase of power consumption while suppressing reduction of the scanning property resulting from deterioration of the properties of the transistor NT23, similarly to the aforementioned seventh embodiment.

Ninth Embodiment

Figure 17:
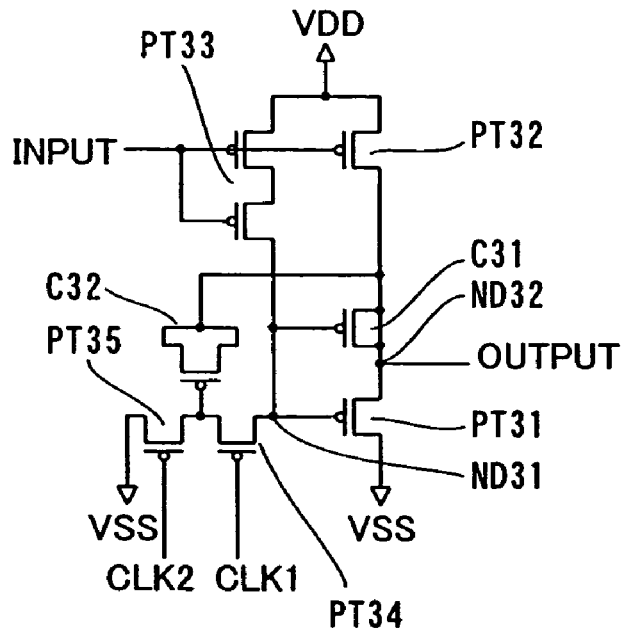
FIG. 17 is a circuit diagram showing each first circuit part of each of shift register circuits constituting an H driver and a V driver of a liquid crystal display according to a ninth embodiment of the present invention.

Referring to FIG. 17, a liquid crystal display according to a ninth embodiment of the present invention suppresses reduction of the scanning property resulting from application of a bias voltage exceeding the potential difference between VDD and VSS to a prescribed transistor while suppressing a penetration current by a method different from those employed in the aforementioned seventh and eighth embodiments.

As shown in FIG. 17, each first circuit part of each of shift register circuits constituting H and V drivers of the liquid crystal display according to the ninth embodiment includes transistors PT31, PT32, PT33, PT34 and PT35 and capacitors C31 and C32 formed by connecting the sources and the drains of transistors with each other. The transistors PT31, PT32, PT33, PT34 and PT35 are examples of the "first transistor", "second transistor", "third transistor", "fourth transistor" and "fifth transistor" in the present invention respectively.

According to the ninth embodiment, all of the transistors PT31 to PT35 and the transistors constituting the capacitors C31 and C32 are constituted of TFTs (thin-film transistors) consisting of p-type MOS (metal oxide semiconductor) field-effect transistors.

According to the ninth embodiment, further, the transistor PT33 is formed to have two gate electrodes electrically connected with each other, similarly to the first embodiment shown in FIG. 3.

As shown in FIG. 17, the transistor PT31 has a source connected to a node ND32, a drain connected to the negative potential VSS and a gate connected to another node ND31. The transistor PT32 has a source connected to the positive potential VDD, a drain connected to the node ND32 and a gate supplied with an input signal.

According to the ninth embodiment, the transistor PT33 is connected between the gate of the transistor PT31 and the positive potential VDD. The gate of this transistor PT33 is supplied with the input signal. The transistor PT33 is provided for turning off the transistor PT31 when the transistor PT32 is in an ON state. Thus, the transistors PT32 and PT31 are inhibited from entering ON states at the same time. The capacitor C31 is connected between the gate and the source of the transistor PT31.

According to the ninth embodiment, the transistor PT34 is connected to the gate of the transistor PT31, while the transistor PT35 is connected between the transistor PT34 and the negative potential VSS. More specifically, the transistor PT34 has a source connected to the gate of the transistor PT31 and a drain connected to the source of the transistor PT35. The drain of the transistor PT35 is connected to the negative potential VSS. The gate of the transistor PT34 is supplied with a clock signal CLK1. The gate of the transistor PT35 is supplied with another clock signal CLK2 obtaining an ON-state period not overlapping with that of the transistor PT34 supplied with the clock signal CLK1. The clock signal CLK1 is an example of the "first signal" in the present invention, and the clock signal CLK2 is an example of the "second signal" in the present invention. The capacitor C32 is connected between the transistors PT34 and PT35.

In operation of each shift register circuit of the liquid crystal display according to the ninth embodiment, the clock signals CLK1 and CLK2 go high and low respectively, thereby turning off and on the transistors PT34 and PT35 respectively. At this time, the capacitor C32 stores the low-level negative potential VSS through the transistor PT35.

Thereafter the input signal goes high thereby turning off the transistors PT32 and PT33. The clock signals CLK1 and CLK2 go low and high respectively, thereby turning on and off the transistors PT34 and PT35 respectively. At this time, the low-level potential stored in the capacitor C32 is supplied through the transistor PT34. Thus, the potential of the node ND31 goes low, thereby turning on the transistor PT31. At this time, the potential of the node ND32 drops toward VSS.

In this case, the potential of the node ND31 (the gate potential of the transistor PT31) drops following reduction of the potential of the node ND32 (the source potential of the transistor PT31) so that the capacitor C31 maintains the gate-to-source voltage of the transistor PT31. The transistors PT33 and PT35 are in the OFF states, whereby the holding voltage of the capacitor C31 (the gate-to-source voltage of the transistor PT31) is maintained. Thus, the transistor PT31 is regularly maintained in the ON state during reduction of the potential of the node ND32, whereby the potential of the node ND32 drops toward VSS. Consequently, the shift register circuit outputs a low-level output signal.

When the potential of the node ND32 drops to VSS, the potential of the node ND31 is lower than VSS. Thus, a bias voltage applied to the transistor PT33 connected to the positive potential VDD exceeds the potential difference between VDD and VSS.

Thereafter the input signal goes low thereby turning on the transistors PT32 and PT33. Further, the clock signals CLK1 and CLK2 go high and low respectively, thereby turning off and on the transistors PT34 and PT35 respectively. Thus, either the transistor PT34 or the transistor PT35 is turned off when the transistor PT33 is in an ON state according to the ninth embodiment. Therefore, the potential of the node ND31 goes high while the transistor PT31 is turned off. Consequently, the potential of the node ND32 goes up to VDD, whereby the shift register circuit outputs a high-level output signal.

According to the ninth embodiment, as hereinabove described, the transistor PT34 turned on in response to the clock signal CLK1 is connected to the gate of the transistor PT31 while the transistor PT35 turned on in response to the clock signal CLK2 obtaining the ON-state period not overlapping with that of the transistor PT34 receiving the clock signal CLK1 is connected between the transistor PT34 and the negative potential VSS so that either the transistor PT34 or the transistor PT35 is regularly in an OFF state, whereby a penetration current can be inhibited from flowing between VSS and VDD through the transistors PT33, PT34 and PT35 also when the transistor PT33 connected to the positive potential VDD is in an ON state.

According to the ninth embodiment, further, the transistor PT33 is formed to have the two gate electrodes electrically connected with each other, thereby distributing a voltage applied to the transistor PT33 between sources and drains corresponding to the gate electrodes respectively substantially about half-and-half (the voltage distribution ratio varies with the transistor size or the like) also when the bias voltage exceeds the potential difference between VSS and VDD and inhibiting the transistor PT33 from deterioration of properties. Consequently, the liquid crystal display can suppress increase of power consumption while suppressing reduction of the scanning property resulting from deterioration of the properties of the transistor PT33.

Tenth Embodiment

In a liquid crystal display according to a tenth embodiment of the present invention, n-channel transistors are employed in place of p-channel transistors in a structure similar to that of the aforementioned ninth embodiment.

Figure 18:
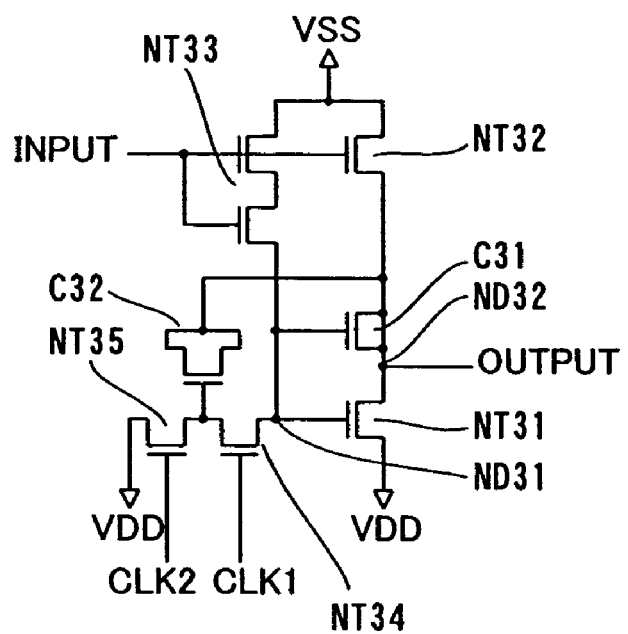
FIG. 18 is a circuit diagram showing each first circuit part of each of shift register circuits constituting an H driver and a V driver of a liquid crystal display according to a tenth embodiment of the present invention.
Figure 19:
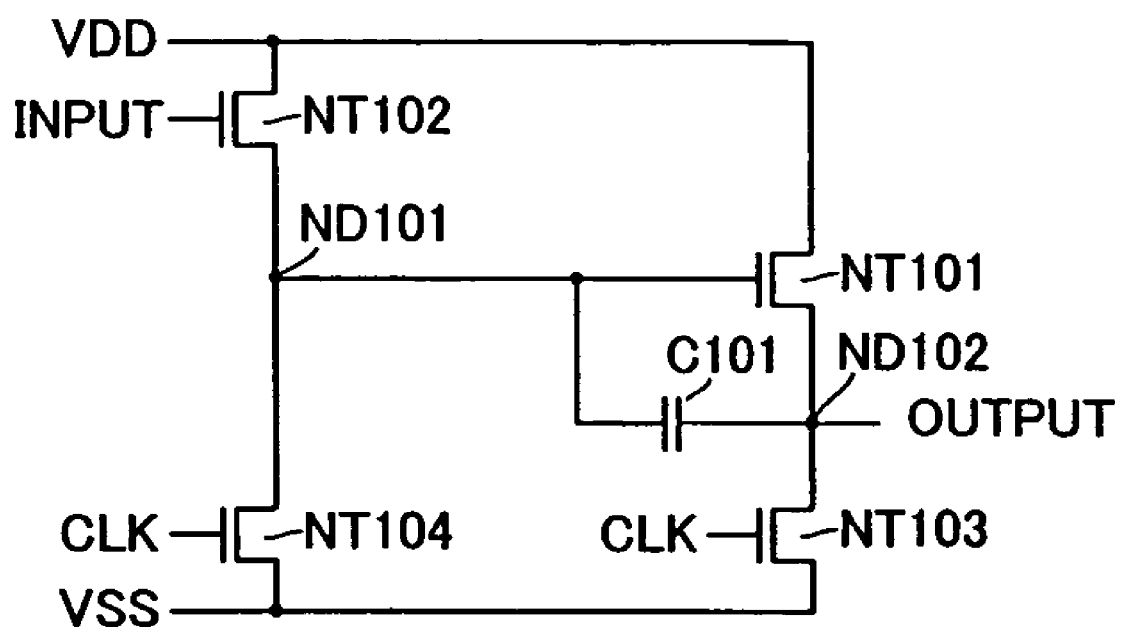
FIG. 19 is a circuit diagram showing a conventional bootstrap inverter circuit.

As shown in FIG. 18, each first circuit part of each of shift register circuits constituting H and V drivers of the liquid crystal display according to the tenth embodiment includes transistors NT31, NT32, NT34 and NT35 and capacitors C31 and C32 formed by connecting the sources and the drains of transistors with each other.

According to the tenth embodiment, all of the transistors NT31 to NT35 and the transistors constituting the capacitors C31 and C32 are constituted of TFTs (thin-film transistors) consisting of n-type MOS (metal oxide semiconductor) field-effect transistors.

According to the tenth embodiment, further, the transistor NT33 is formed to have two gate electrodes electrically connected with each other, similarly to the third embodiment shown in FIG. 9.

As shown in FIG. 18, the sources of the transistors NT32 and NT33 are connected to a negative potential VSS respectively, while the drains of the transistors NT31 and NT35 are connected to a positive potential VDD respectively.

The remaining structure of the tenth embodiment is similar to that of the aforementioned ninth embodiment.

According to the tenth embodiment having the aforementioned structure, the liquid crystal display can suppress increase of power consumption while suppressing reduction of the scanning property resulting from deterioration of the properties of the transistor NT33, similarly to the aforementioned ninth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, the present invention is not restricted to each of the aforementioned embodiments but is also applicable to a display other than a liquid crystal display and an organic EL display.

Further, the present invention is not restricted to each of the aforementioned embodiments but may alternatively be applied to the shift registers of both of H and V drivers. In this case, the display can be further inhibited from reduction of the scanning property and increase of power consumption.

What is claimed is:

1. A display comprising a shift register circuit formed by connecting a plurality of first circuit parts each including a first conductivity type first transistor connected to a first potential and turned on in response to a clock signal, a first conductivity type second transistor connected to a second potential and a first conductivity type third transistor, connected between the gate of said first transistor and said second potential, having two gate electrodes electrically connected with each other.

2. The display according to claim 1, wherein
said two gate electrodes of said third transistor have a function of distributing a voltage applied to said third transistor into two.

3. The display according to claim 1, wherein
each said first circuit part further includes a diode-connected fourth transistor, connected between the gate of said first transistor and a clock signal line supplying said clock signal, having two gate electrodes electrically connected with each other.

4. The display according to claim 3, wherein
said two gate electrodes of said fourth transistor have a function of distributing a voltage applied to said fourth transistor into two.

5. The display according to claim 3, wherein
said fourth transistor is a p-type field-effect transistor.

6. The display according to claim 1, wherein
each said first circuit part further includes a fourth transistor connected between the gate of said first transistor and a clock signal line supplying said clock signal and turned on in response to a signal obtaining an ON-state period not overlapping with an ON-state period of said third transistor.

7. The display according to claim 6, wherein
said fourth transistor is a p-type field-effect transistor.

8. The display according to claim 6, wherein
a diode-connected fifth transistor is connected between the gate of said first transistor and said clock signal line supplying said clock signal.

9. The display according to claim 8, wherein
said fifth transistor is a p-type field-effect transistor.

10. The display according to claim 1, wherein
each said first circuit part further includes a fourth transistor connected to the gate of said first transistor and turned on in response to a first signal and a fifth transistor connected between said fourth transistor and said first potential and turned on in response to a second signal obtaining an ON-state period not overlapping with an ON-state period of said fourth transistor receiving said first signal.

11. The display according to claim 10, wherein
said fourth and fifth transistors are p-type field-effect transistors.

12. The display according to claim 1, wherein
a capacitor is connected between the gate and the source of said first transistor.

13. The display according to claim 1, wherein
said third transistor has a function of turning off said first transistor when said second transistor is in an ON state.

14. The display according to claim 1, wherein
at least said first transistor, said second transistor and said third transistor are p-type field-effect transistors.
15. The display according to claim 1, wherein
said shift register circuit is applied to at least either a shift register circuit for driving a drain line or a shift register circuit for driving a gate line.
16. The display according to claim 15, wherein
said drain line driven by said shift register circuit has a function of supplying a video signal to a display pixel including a liquid crystal.
17. The display according to claim 15, wherein
said drain line driven by said shift register circuit has a function of supplying a video signal to a display pixel including an EL element.
18. The display according to claim 1, wherein
a high-resistance resistor is connected between the gate of said first transistor and a clock signal line supplying said clock signal.

* * * * *